US011476978B2

United States Patent
Maierbacher

(10) Patent No.: US 11,476,978 B2
(45) Date of Patent: Oct. 18, 2022

(54) METHOD FOR LINEAR ENCODING OF SIGNALS FOR THE REDUNDANT TRANSMISSION OF DATA VIA MULTIPLE OPTICAL CHANNELS

(71) Applicant: OSRAM GmbH, Munich (DE)

(72) Inventor: Gerhard Maierbacher, Munich (DE)

(73) Assignee: OSRAM GmbH, Munich (DE)

( * ) Notice: Subject to any disclaimer, the term of this patent is extended or adjusted under 35 U.S.C. 154(b) by 163 days.

(21) Appl. No.: 16/648,291

(22) PCT Filed: Sep. 18, 2018

(86) PCT No.: PCT/EP2018/075249
§ 371 (c)(1),
(2) Date: Mar. 18, 2020

(87) PCT Pub. No.: WO2019/053296
PCT Pub. Date: Mar. 21, 2019

(65) Prior Publication Data
US 2020/0287661 A1 Sep. 10, 2020

(30) Foreign Application Priority Data
Sep. 18, 2017 (DE) .................. 10 2017 008 732.6

(51) Int. Cl.
*H04L 1/08* (2006.01)
*H04B 10/516* (2013.01)
(Continued)

(52) U.S. Cl.
CPC ............ *H04L 1/08* (2013.01); *H04B 10/516* (2013.01); *H04B 10/66* (2013.01); *H04J 14/02* (2013.01); *H04L 1/004* (2013.01)

(58) Field of Classification Search
CPC ......... H04L 1/08; H04L 1/004; H04B 10/516; H04B 10/66; H04J 14/02
See application file for complete search history.

(56) References Cited

U.S. PATENT DOCUMENTS

| 2004/0185796 A1* | 9/2004 | Kruk | ..................... H04L 1/04 455/84 |
| 2014/0023371 A1* | 1/2014 | Nanjo | ................. H04J 14/0295 398/79 |

FOREIGN PATENT DOCUMENTS

| DE | 10133518 A1 | 1/2003 |
| EP | 1039669 A2 | 9/2000 |

(Continued)

OTHER PUBLICATIONS

International Search Report issued for corresponding PCT-Application No. PCT/EP2018/075249, dated Sep. 29, 2018, 18 pages (for informational purpose only).

*Primary Examiner* — Mina M Shalaby
(74) *Attorney, Agent, or Firm* — Viering, Jentschura & Partner Mbb

(57) ABSTRACT

A method for the redundant transmission of data by means of light-based communication may include a data stream to be transmitted that is converted into symbols. This data stream is converted from bipolar symbols into multiple partial data streams having e.g. unipolar-positive symbols. The partial data streams are converted into multiple semi-redundant signals that are then transmitted to the receiver via multiple light-based channels. In the receiver, the received signals are converted back again analogously to when they were sent, in order to obtain the original data stream again.

15 Claims, 13 Drawing Sheets

(51) Int. Cl.
*H04B 10/66* (2013.01)
*H04J 14/02* (2006.01)
*H04L 1/00* (2006.01)

(56) References Cited

FOREIGN PATENT DOCUMENTS

EP    1061685  A1    12/2000
EP    1061685  A2 *  12/2000    .......... H04J 14/0294

* cited by examiner

METHOD FOR LINEAR ENCODING OF SIGNALS FOR THE REDUNDANT TRANSMISSION OF DATA VIA MULTIPLE OPTICAL CHANNELS

CROSS-REFERENCE TO RELATED APPLICATIONS

The present application is a national stage entry according to 35 U.S.C. § 371 of PCT application No.: PCT/EP2018/075249 filed on Sep. 18, 2018; which claims priority to Germany application No.: 10 2017 008 732.6, which was filed on Sep. 18, 2017; both of which are incorporated herein by reference in their entirety and for all purposes.

TECHNICAL FIELD

The invention is concerned with a method for linear encoding of signals for the redundant transmission of data via multiple optical channels.

BACKGROUND

Wireless communication is ubiquitous and there is an ever increasing need for high-speed mobile data connection. The frequency spectrum for radio-based wireless communication is becoming a rare resource. Therefore, in the near future, radio-based communication technologies may be supplemented or even replaced by optical wireless communication (OWC). In optical wireless communication, light is used as a medium for the data transmission. Visible light (Visible Light Communication, VLC), infrared (IR), near infrared (NIR) or light of other wavelengths can be used for the transmission.

At the same time, light-based transmission is insensitive to EMI. This is of interest for use in industrial environments, for example, where radio connections can be disturbed by electric motors, strong magnetic fields and electric welding work, for instance.

Light cannot penetrate, or can penetrate only with very great difficulty, through obstacles such as walls and doors, for example. This property can be exploited to make available a wireless communication technology locally and in a manner safeguarded against eavesdropping. This would be of interest for example for conference rooms, or for devices having increased security requirements.

On account of the properties of light, a line of sight (LoS) is advantageous for light-based data transmission. Shading, for example caused by the human body, and mobility, for example caused by movement of components to which information is intended to be transmitted, pose a technical challenge requiring a suitable solution.

In order to enable a data connection in virtually any arbitrary orientation of the communication device and thus to avoid shading (caused e.g. by the human body), a plurality of lines of sight (LoS) or transmission paths can be utilized simultaneously for a redundant transmission. In this way, given a suitable design of the system, the data connection can be maintained even if individual lines of sight (LoS) or the corresponding transmission paths are interrupted. This corresponds to a spatially redundant transmission presupposing the use of multiple transmission and reception components.

As already described above, light-based communication has many advantages. Alongside the advantages mentioned, however, there are also some challenges since what is regarded as an advantage in regard to security aspects, namely that light-based communication does not pass through walls and around corners, is a disadvantage from the standpoint of transmission reliability. If a reliable transmission is no longer ensured merely because the receiver is not in a direct line of sight with the transmitter or there are some sources of interference between them, many application scenarios for light-based communication become unsustainable. Therefore, it is necessary to find a robust, redundancy-based transmission method in which transmission reliability is afforded even under poor conditions on account of the redundancy via multiple channels. In contrast to radio-based communication, in the case of light-based communication there are few restrictions regarding the number of transmission channels. In principle, each individual light wavelength can be regarded as a channel, and the channels require little minimum separation from one another, with the result that very many channels could be utilized in the spectrum under consideration.

In practice, of course, the light spectra which a luminaire equipped for light-based communication would emit anyway will be utilized. Therefore, the number of channels is already restricted in practice for cost reasons. Nevertheless, enough channels that can be utilized for transmission are available in practice for light-based communication.

Generally the problem is such that, of course, as many data as possible per unit time are intended to be transmitted via a channel or via the existing channels available. Boundary conditions such as the number of channels available, the bandwidth per channel, available transmission time slots/transmission time slices, code division multiplex methods and spreading sequences, and the channel configuration are of importance in this case.

It goes without saying that the reliability and the robustness of the transmission in difficult environments are accorded a very high significance, and so what counts is no longer just purely the data transmission speed. As examples of such environments or scenarios, mention shall be made here of highly dynamic mobile environments, scenarios with a very low signal-to-noise ratio and scenarios with severe interference (e.g. military applications with interference attacks).

In order to achieve a secure, robust and reliable data transmission, various measures can be implemented:

By way of example, strong encoding (Forward Error Correction/FEC) can be used for each channel, although this results in a high computation complexity with a large amount of memory being required. It is possible to use a transmission method comprising a retransmission of data in the event of inadequate reception. This has the disadvantage that delays can occur on account of the resending. Therefore, such transmission methods are not always suitable for real-time applications. Under unfavorable conditions, the data can also be lost since they can never be received without errors even in the event of multiple transmission. Finally, there is the possibility of redundant transmission via more than one channel, which leads to a lower data rate, of course, since bandwidth is wasted for the redundancy. This may of course be unimportant in some scenarios since here the reliability of the error-free transmission assumes a far higher significance than "wasting" multiple channels for transmission purposes.

Generally it is the case that by virtue of the very high data rate available in the case of light-based communication, the data rate that can be realized is not the primary concern, rather the reliability of the data transmission assumes a higher significance.

Ideally RGB (red-green-blue) LEDs or laser diodes are used for light-based communication. Three almost orthogonal channels are thus available almost without mutual crosstalk. In this case, the fundamental problem of light-based communication remains that a direct line of sight produces an excellent signal with a very good signal-to-noise ratio, whereas an indirect connection by way of reflection at a surface produces a very weak signal with a very small signal-to-noise ratio.

Some methods for data transmission which can be utilized for light-based communication as well exist in the prior art.

It is generally known to transmit data simultaneously via multiple channels in order to increase the data rate. In this case, the data are divided in a multiplex method and transmitted via the various channels. A redundancy is not produced in this method; therefore, this method is not suitable for ensuring an increased robustness of the data transmission. If this method is applied to RGB channels, for example, then this is referred to as "wavelength division multiplex", WDM for short. The known multiplex methods are described in the Wikipedia article (https://de.wikipedia.org/wiki/Multiplexverfahren).

However, if the same data are transmitted via multiple channels, then these channels are redundant with respect to one another; consequently, an increased reliability is afforded here, in principle, since, in the event of transmission errors in one channel, the same data are available on another channel.

Solutions are conceivable, in principle, between these two extremes. This will be discussed below.

As already described above, the prior art discloses two methods for transmitting data via multiple channels.

The first method is illustrated in FIG. 1, and is a method without any redundancy. The data x to be transmitted are input into an input 31. They are divided into three data streams in a demultiplexer 33. Each data stream is converted into an analog signal x1, x2, x3 in a digital-to-analog converter D/A. Said analog signal is emitted in a respective transmission transducer 371, 372, 373 via a respective channel CH1, CH2, CH3. The channels here are e.g. orthogonal channels that are emitted respectively by a red, a green, and a blue LED. At the receiver end, each signal on each channel is in turn received by a reception transducer 374, 375, 376, and applied as signal x1', x2', x3' to a respective analog-to-digital converter A/D, which converts these signals back into digital signals again. The latter are then input into a multiplexer 34, which then in turn converts three signals into one output signal x', which is then output at an output 32. If everything functions properly, then the output signal is identical to the input signal. In the event of interference e.g. on a channel, however, the original signal can no longer be produced at the receiver end, and transmission disturbances occur. Thus, all n=3 channels are required without errors in order to be able to re-establish the output signal. If the signal of a channel is lost, then the original signal can no longer be produced.

These problems are avoided in a second method, in which the data are transmitted with full redundancy. The arrangement is similar to that in the first method; a signal is input into an input 31. The demultiplexer 33 does not become active here, however, but rather forwards copies of the signal to the individual digital-to-analog converters D/A, the latter converting the signal into an analog signal x1. This signal is then input into a redundancy function module 35, which in this case duplicates the signal and outputs it to each of the three channels as signal s1, s2, s3. These three signals are in turn fed into a respective transmission transducer 371, 372, 373 and transmitted via a respective channel CH1, CH2, CH3 (red, green, blue).

At the receiver end, these signals are then in turn received by a respective reception transducer 374, 375, 376 and input as signals y1, y2, y3 into a calculation module 36, which in turn calculates the reconstructed analog signal x1' from the three actually duplicate signals.

Said analog signal x1' is then converted into a digital signal in an analog-to-digital converter and fed to a multiplexer, which in this case simply passes on the signal. The signal is then converted into the original signal in a reception converter 39 and output at the output 32.

As a result of the triple redundancy, only one correctly communicated signal of one channel is necessary in order to reconstruct the original signal. Thus, two channels can be transmitted incorrectly or poorly, and the original signal can nevertheless still be reconstructed correctly. Thus, e.g. if the red channel is disturbed and the green channel is very severely noisy, then the blue channel can be used, and the signal can be transmitted correctly. As a result of the full redundancy via all available channels, potentially high operational reliability and robustness vis à vis interference can be achieved.

A disadvantage of this method, however, is that the bandwidth of the data transmission is significantly smaller than in the case of the first method as a result of the full redundancy.

It is desirable to avoid the disadvantages of the first and second methods and to specify a method for data transmission via multiple channels which can be better adapted to required boundary conditions such as transmission reliability and bandwidth.

SUMMARY

The object is achieved by a method for the redundant transmission of data by means of light-based communication, comprising the following steps:
converting the data to a transmission data stream or stream of bipolar data symbols in a transmission converter,
dividing the transmission data stream into at least one transmission-end partial data stream by means of a demultiplexer,
converting the at least one transmission-end partial data stream into at least one signal having at least one component in a redundancy function module,
transmitting said at least one signal in one transmission per component by means of at least one transmission transducer via at least one light-based transmission channel,
receiving the at least one signal in at least one reception transducer,
converting the at least one received signal into at least one reception-end partial data stream in a calculation module,
combining the reception-end partial data streams into a reception data stream by means of a multiplexer,
converting the reception data stream into the original data in a reception converter,
wherein for generating the redundancy either the number of light-based transmission channels is greater than the number of partial data streams, or for generating the redundancy the number of transmissions per channel is greater than the number of partial data streams, or for generating the redundancy the product of the light-based transmission channels and the transmissions per channel is greater than the number of partial data streams.

What is particularly advantageous about this method is the step-by-step conversion of the data stream, which ensures that the method is particularly efficient under virtually all conceivable boundary conditions and the data can be transmitted particularly rapidly and reliably. Advantageously, for this purpose provision is made for utilizing multiple available optical channels for the parallel transmission of partial data streams and, given enough channels, also transmitting redundant partial data streams via the channels. In this regard, the original data stream can advantageously be reconstructed reliably even under poor conditions and in the event of partial channel dropouts. If enough optical channels are not available, the partial data streams or symbols are transmitted serially with additional redundant data via the available channels in order that the original data stream can be reconstructed reliably even in the event of a partial channel dropout.

In one particularly advantageous configuration, the demultiplexer operates as a polarity separating module and the multiplexer operates as a polarity combining module, wherein the polarity separating module generates two unipolar-positive transmission-end partial data streams, from the bipolar transmission data stream, and the polarity combining module generates a bipolar reception data stream from two unipolar-positive reception-end partial data streams. In the case of light-based channels, which cannot directly transmit negative values, this is a particularly advantageous solution since here all values are positive, and the original bipolar data stream can easily be reconstructed again by virtue of the particular processing.

In a further advantageous embodiment, for forming redundancy linear combinations of the partial data streams are formed, and the latter are transmitted via an additional channel and/or in an additional transmission. In this case, the linear combinations can be described in the form $\tilde{A} \cdot \bar{x} = \bar{s}$, wherein $\tilde{A}$ is an N×n matrix. Linear combinations of the partial data streams are able to be calculated and result again easily and with little computing power, and particularly advantageously a plurality of partial data streams can be combined in a linear combination to form one partial data stream. Thus, very easily and efficiency, it is possible to create the necessary redundancy in order to make the method particularly reliable and efficient.

In a non-limiting embodiment, n arbitrarily selected rows in the matrix $\tilde{A}$ are linearly independent with respect to one another. This constitutes the easiest and most effective implementation of redundancy formation.

In one embodiment, n=2 and N=3.

In another embodiment, n=2 or n=3 and N=4.

In one embodiment, for each row in $\tilde{A}$ the sum of the coefficients is equal to 1.

In one embodiment, a bandpass modulation method is used as output signal in the transmission converter and as input signal in the reception converter.

In another embodiment, a modulation method with a real baseband signal is used as output signal in the transmission converter and as input signal in the reception converter.

In a further embodiment, a modulation method with a unipolar signal is used as output signal in the transmission converter and as input signal in the reception converter.

In another embodiment, a modulation method with a bipolar signal is used as output signal in the transmission converter and as input signal in the reception converter, wherein said output signal is converted into two unipolar-positive signals in the polarity separating module, and receptively in the polarity combining module the unipolar-positive signals are converted into the input signal. This is particularly advantageous in the case of light-based transmission since light cannot assume negative values, but rather is able to be modulated only "from dark to bright". Inverting the negative signal components means that there are only unipolar-positive components, which, particularly advantageously, can be transmitted by means of light-based channels without high further modulation complexity.

In a non-limiting embodiment, an orthogonal frequency division multiplex method is used for calculating the partial data streams. The orthogonal frequency division multiplex method is a special implementation of multicarrier modulation, and a modulation method which uses a plurality of orthogonal carriers for digital data transmission. As a result, the individual carriers interfere with one another only very little, which advantageously leads to a particularly robust and adaptable transmission of the data.

In one embodiment, an orthogonal frequency division multiplex method with inverted negative signal components is used. This is particularly advantageous in the case of light-based transmission since light cannot assume negative values, but rather is able to be modulated only "from dark to bright". Inverting the negative signal components means that there are only unipolar-positive components, which, particularly advantageously, can be transmitted by means of light-based channels without high further modulation complexity.

In one embodiment, a conditional expected value is used for converting the at least one received signal into at least one reception-end partial data stream in a calculation module. Advantageously, the conditional expected value functions with uniform and nonuniform source signal distributions, likewise with diverse types of channels and/or transmission symbols.

In another embodiment, a selection of reception signals is used for converting the at least one received signal into at least one reception-end partial data stream in a calculation module. This method functions only for full redundancy of the transmission; in a non-limiting embodiment, the decision can be taken on the basis of the signal strength or the signal-to-noise ratio of the reception signals.

In another embodiment, weighted constructive combining according to the signal/noise ratio is used for converting the at least one received signal into at least one reception-end partial data stream in a calculation module. This method combines the signal streams in a weighted manner according to their signal-to-noise ratio. The weighting factor of the individual signal is proportional to the signal-to-noise ratio thereof. The individual signal streams and/or channels or branches are advantageously combined linearly in a coherent manner, specifically in such a way that the signal-to-noise ratio of the output signal is maximal.

In another embodiment, additive constructive combining is used for converting the at least one received signal into at least one reception-end partial data stream in a calculation module. In this method, the available signals are simply added. This method is used for an n-out-of-N redundancy scheme by the n strongest signals being used for the solution of the linear equations.

In a non-limiting embodiment, for transmission via a light-based transmission channel, use is made of an intensity modulation with a direct detection during reception. This method is particularly advantageous for light-based communication because the optical output intensity of a source is varied in accordance with a property of the modulation signal. The envelope of the modulated optical signal is an analog of the modulating signal in the sense that the instantaneous intensity of the envelope is an analog of the property of interest of the modulating signal. The modulating signal is re-established here by direct detection.

The use of the term "light-based" shall be defined briefly hereinafter: "light-based" is used synonymously with "using light". Light should be considered to be electromagnetic waves that are in a frequency range generally referred to as "light". This includes light visible to human beings, but also the longer and shorter wavelengths, that is to say infrared light and also ultraviolet light. Expressed in wavelengths, that is approximately the range of from 10 nm to 10 µm. An overview regarding classification can be found in the encyclopedia Wikipedia: https://de.wikipedia.org/wiki/Licht#/media/File:Electromagnetic_spectrum_-de_c.svg An "optoelectronic element" hereinafter is an element which can either generate or receive light-based signals. Part of an optoelectronic element here can be e.g. a light emitting diode or a photodiode. However, a laser diode or a photoresistor can likewise be involved. An emission optical unit or reception optical unit that may be necessary can be part of the optoelectronic element.

A transmission transducer hereinafter is a device suitable for emitting light-based signals. A transmission transducer is therefore able to convert information input into it into light-based signals and to radiate them. A transmission transducer must accordingly comprise an optoelectronic element.

A reception transducer hereinafter is a device that works in the opposite direction to the transmission transducer. A reception transducer is able to convert light-based signals into information and to output it. A reception transducer must accordingly likewise comprise an optoelectronic element.

In practice, on account of the generally bidirectional communication, transmission transducer and reception transducer are usually used together, i.e. as a pair. Therefore, the two terms hereinafter also stand for a combined transceiver transducer.

BRIEF DESCRIPTION OF THE DRAWINGS

Further advantages, features and details of various embodiments are evident on the basis of the following description and with reference to the drawings, in which identical or functionally identical elements are provided with identical reference symbols. Here in the figures.

Elements which are the same or of the same type, or which have the same effect, are provided with the same references in the figures.

The figures are respectively schematic representations and therefore not necessarily true to scale. Rather, relatively small elements, and in particular layer thicknesses, may be represented exaggeratedly large for illustration.

DETAILED DESCRIPTION

Figure 1:
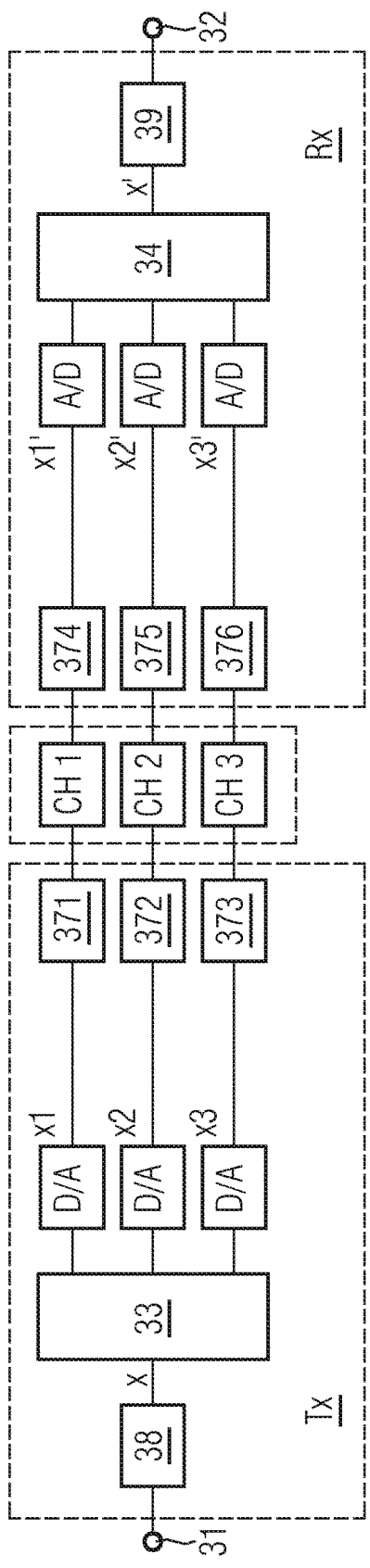
FIG. 1 shows a schematic circuit diagram of the data streams in the first method according to the prior art.
Figure 2:
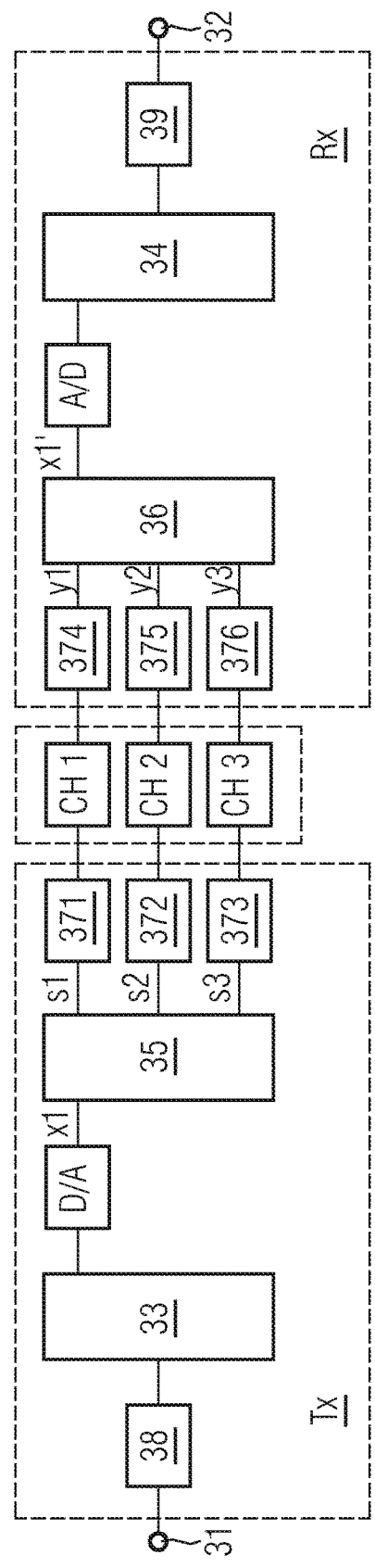
FIG. 2 shows a schematic circuit diagram of the data streams in the second method according to the prior art.
Figure 3:
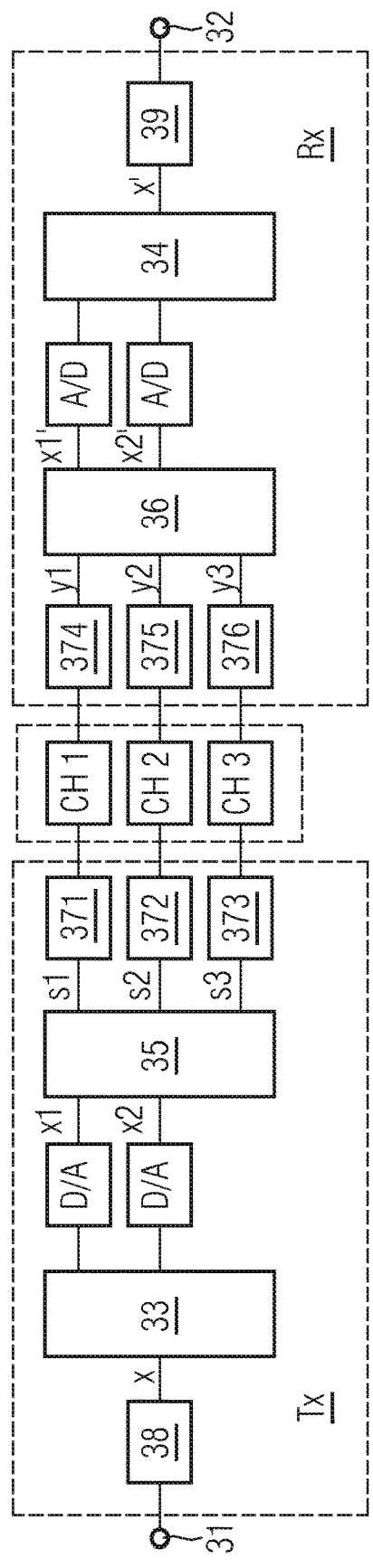
FIG. 3 shows a schematic circuit diagram of the data streams in a first embodiment.

FIG. 3 shows a first embodiment of the proposed method, which does not have the disadvantages of the known prior art.

A data signal is input into an input 31 of a transmission module Tx. Said signal is converted into a transmission data stream x in a transmission converter 38, and said transmission data stream is divided into two partial data streams in a demultiplexer 33, said partial data streams in turn being converted into two analog partial data streams x1 and x2 in two digital-to-analog converters D/A. Said analog partial data streams are input into a redundancy function module 35, which generates three signals s1, s2, s3 for three independent channels from the two partial data streams. Said signals are then input into three transmission transducers 371, 372, 373, which respectively emit a signal s1, s2, s3 via a channel Ch1, Ch2, Ch3. The transmission converter 38 receives as input the bits/bytes of the data signal and converts them into time-discrete symbols. The transmission data stream x thus consists of a sequence of time-discrete symbols u(k), wherein k is an index for the sequence of the time-discrete symbols. The sequence of said time-discrete symbols u(k) thus forms the transmission data stream x. Examples of time-discrete symbols are samples of an analog signal, samples of a bandpass signal (e.g. QAM, OFDM), time-discrete real baseband symbols (e.g. ASK, OFDM with Hermitian symmetry), time-discrete unipolar baseband symbols (DCO-OFDM), or time-discrete unipolar data symbols (OOK, PAM). An example is likewise symbols of temporary intermediate variables, such as in the Flip-OFDM method, for example, in which real baseband symbols are first generated before they are then converted into unipolar symbols (in a subsequent step).

The signals are received in three reception transducers 374, 375, 376 and are input as signals y1, y2, y3 into a calculation module 36, in which two partial data streams x1', x2' are reconstructed from the three received signals. These two analog partial data streams are input into a respective analog-to-digital converter A/D, which generates two digital partial data streams from the analog partial data streams. Said digital partial data streams are input into a multiplexer 34, which generates the reconstructed reception data stream x' from the partial data streams x1' and x2'. In a reception converter 39, said reconstructed reception data stream is then converted into a reception signal and output at the output 32. The reception converter 39 operates the other way round to the transmission converter 38; it converts the received time-discrete symbols into bits and/or bytes again.

Thus, two partial data streams are transmitted via three independent channels. A redundancy is thus afforded, making it possible, in the event of interference on one of the independent channels, nevertheless to reconstruct the original transmission data stream x. The three independent channels can for example be three channels of light-based communication and be established in frequency ranges of the colors red, green and blue. Thus, if one of the channels is disturbed and no data can be transmitted via this channel, then the original transmission data stream can nevertheless be re-established.

The proposed method is thus established between the two known methods "no redundancy" and "full redundancy", and thus represents a compromise between the available data rate and the robustness of the transmission channel.

Of course, the method can also be adapted for more independent transmission channels; care must merely be taken to ensure that there are more transmission channels than data streams, in order to ensure a (partly) redundant transmission.

The calculation module 36 reconstructs the partial data streams x1', x2' from the signals y1, y2, y3 received via the individual channels, said partial data streams ideally being identical to the original partial data streams x1, x2. For this purpose, it is possible to formulate various mathematical methods which take account of the processes in the redundancy function module 35 and are employed in the calculation module 36.

The redundancy function module 35 can e.g. transmit the two partial data streams x1 and x2 on two channels and transmit a linear combination 1*x1+1*x2 of the two partial data streams on the third channel. This ensures that in the event of one of the three channels being lost, the original signal can nevertheless be reconstructed.

To summarize, it may thus be stated that the method described above is applicable if N>=2 channels are present.

Stipulations regarding the amplitude can be taken into account suitably here. This is helpful particularly in the case of transmission channels which utilize light as a transmission medium, if said light is intended at the same time to serve for illumination and is additionally dimmable as well.

The method can be used in the discrete time domain, on the one hand, or in the analog domain, as described above. It is possible to realize very simple designs with a single transducer.

The method will be discussed below on the basis of an example which once again utilizes a linear combination for obtaining redundancy. It is initially assumed that there are more than two channels for the transmission. For more than two channels, it is possible to implement the following redundancy schemes for the transmission:

All n=N transmitted signals are required for the decoding. This is referred to as N-out-of-N redundancy. It may also be stated here that there is no redundancy whatsoever.

n=N−1 transmitted signals are required for the decoding. This is referred to as N−1-out-of-N redundancy.

n=N−2 transmitted signals are required for the decoding. This is referred to as N−2-out-of-N redundancy.

n=1 out of N transmitted signals are required for the decoding. This is also referred to as 1-out-of-N redundancy, and corresponds to full redundancy.

The N signals transmitted via N channels are formed as a linear combination from n original signals x1, x2, . . . , xn, wherein n is an element from $\{1, 2, \ldots, N\}$. The linear equations can be represented as follows:

$$a1*x1+a2*x2+ \ldots +an*xn,$$

wherein a1, a2, . . . an are real-valued coefficients or weighting factors. The choice of the coefficients is described below; it holds true, however, that a1, a2, . . . an must not simultaneously be equal to zero.

Some examples that are intended to illustrate the principle are shown below.

Example 1

N=2 Channels

| Transmitted signals | n = 2-out-of-N = 2 redundancy (no redundancy) | 1-out-of-2 redundancy (full redundancy) |
|---|---|---|
| Channel 1 | s1 = 1*x1 + 0*x2 | s1 = x1 |
| Channel 2 | s2 = 0*x1 + 1*x2 | s2 = x1 |

For N=2, only the n=2-out-of-N=2 and the n=1-out-of-N=2 redundancy schemes exist. Examples in respect thereof are presented above. No redundancy prevails if n=2 out of the N=2 signals are required to re-establish the original signal. Full redundancy is afforded if each n=1 signal out of the two N=2 signals can be used to re-establish the original signal. For each redundancy scheme, the signals to be transmitted can be represented as a linear combination:

for no redundancy: a1*x1+a2*x2 for full redundancy: a1*x1

Example 2

N=3 Channels

| Transmitted signals | 3-out-of-3 redundancy (no redundancy) | 2-out-of-3 redundancy | 1-out-of-3 redundancy (full redundancy) |
|---|---|---|---|
| Channel 1 | s1 = x1 | s1 = x1 | s1 = x1 |
| Channel 2 | s2 = x2 | s2 = x2 | s2 = x1 |
| Channel 3 | s3 = x3 | s3 = 0.5*x1 + 0.5*x2 | s3 = x1 |

For N=3, the following known redundancy schemes exist:

No redundancy, wherein n=3-out-of-N=3 signals are required to re-establish the original signal.

Full redundancy, wherein n=1-out-of-N=3 signals are required to re-establish the original signal.

As described above, a further redundancy scheme is proposed here, which is referred to as 2-out-of-3 redundancy. In this case, n=2-out-of-N=3 signals are needed to re-establish the original signal. This redundancy scheme thus lies between the known schemes described above.

Here, too, a linear combination of the signals to be transmitted can be specified for each redundancy scheme:

for "no redundancy": a1*x1+a2*x2+a3*x3 for "2-out-of-3 redundancy": a1*x1+a2*x2 for "full redundancy": a1*x1

Example 3

N=4 Channels

| Transmitted signals | 4-out-of-4 redundancy (no redundancy) | 3-out-of-4 redundancy | 2-out-of-4 redundancy | 1-out-of-4 redundancy (full redundancy) |
|---|---|---|---|---|
| Channel 1 | x1 | x1 | x1 | x1 |
| Channel 2 | x2 | x2 | x2 | x1 |
| Channel 3 | x3 | x3 | 1*x1 + 1*x2 | x1 |
| Channel 4 | x4 | 1*x1 + 1*x2 + 1*x3 | 2*x1 + 1*x2 | x1 |

For N=4 the following redundancy schemes exist:

No redundancy, wherein n=4-out-of-N=4 signals are required to re-establish the original signal: a1*x1+a2*x2+a3*x3+a4*x4.

3-out-of-4 redundancy; in this case, three of the four signals are needed to re-establish the original signal: a1*x1+a2*x2+a3*x3.

2-out-of-4 redundancy; in this case, two of the four signals are needed to re-establish the original signal: a1*x1+a2*x2.

Full redundancy, wherein n=1-out-of-N=4 signals are required to re-establish the original signal: a1*x1.

Example 4

N=5 Channels

| Transmitted signals | 5-out-of-5 redundancy (no redundancy) | 4-out-of-5 redundancy | 3-out-of-5 redundancy | 2-out-of-5 redundancy | 1-out-of-5 redundancy (full redundancy) |
|---|---|---|---|---|---|
| Channel 1 | x1 | x1 | x1 | x1 | x1 |
| Channel 2 | x2 | x2 | x2 | x2 | x1 |
| Channel 3 | x3 | x3 | x3 | 1*x1 + 1*x2 | x1 |
| Channel 4 | x4 | x4 | 1*x1 + 1*x2 + 1*x3 | 2*x1 + 1*x2 | x1 |
| Channel 5 | x5 | 1*x1 + 1*x2 + 1*x3 + 1*x4 | 2*x1 + 2*x2 + 1*x3 | 1*x1 + 2*x2 | x1 |

For N=5 the following redundancy schemes exist:

No redundancy, wherein n=5-out-of-N=5 signals are required to re-establish the original signal: a1*x1+a2*x2+a3*x3+a4*x4+a5*x5.

4-out-of-5 redundancy; in this case, four of the five signals are needed to re-establish the original signal: a1*x1+a2*x2+a3*x3+a4*x4.

3-out-of-5 redundancy; in this case, three of the five signals are needed to re-establish the original signal: a1*x1+a2*x2+a3*x3.

2-out-of-5 redundancy; in this case, two of the five signals are needed to re-establish the original signal: a1*x1+a2*x2.

Full redundancy, wherein n=1-out-of-N=5 signals are required to re-establish the original signal: a1*x1.

Generally the linear combination can be written in matrix notation as follows: $\tilde{A} \cdot \bar{x} = \bar{s}$; wherein $\tilde{A}$ is an N×n matrix containing the corresponding coefficients an for each channel and each original signal xn;

$\bar{x} = [x1, x2, \ldots, xn]^T$ is a column vector of the length n of the original signal;

$\bar{s} = [s1, s2, \ldots, sN]^T$ is a column vector of the length N of the transmitted signal.

The redundancy schemes of the fourth example represented above are represented in vector notation below.

In vector notation, the redundancy scheme "no redundancy" appears as follows:

$$\begin{bmatrix} 1 & & & & \\ & 1 & & & \\ & & 1 & & \\ & & & 1 & \\ & & & & 1 \end{bmatrix} \cdot \begin{bmatrix} x_1 \\ x_2 \\ x_3 \\ x_4 \\ x_5 \end{bmatrix} = \begin{bmatrix} s_1 \\ s_2 \\ s_3 \\ s_4 \\ s_5 \end{bmatrix}$$
$$\tilde{A} \qquad \bar{x} \qquad \bar{s}$$

The redundancy scheme "4-out-of-5 redundancy" appears as follows in vector notation:

$$\begin{bmatrix} 1 & & & \\ & 1 & & \\ & & 1 & \\ & & & 1 \\ 1 & 1 & 1 & 1 \end{bmatrix} \cdot \begin{bmatrix} x_1 \\ x_2 \\ x_3 \\ x_4 \end{bmatrix} = \begin{bmatrix} s_1 \\ s_2 \\ s_3 \\ s_4 \\ s_5 \end{bmatrix}$$
$$\tilde{A} \qquad \bar{x} \qquad \bar{s}$$

The redundancy scheme "3-out-of-5 redundancy" appears as follows in vector notation:

$$\begin{bmatrix} 1 & & \\ & 1 & \\ & & 1 \\ 1 & 1 & 1 \\ 2 & 2 & 1 \end{bmatrix} \cdot \begin{bmatrix} x_1 \\ x_2 \\ x_3 \end{bmatrix} = \begin{bmatrix} s_1 \\ s_2 \\ s_3 \\ s_4 \\ s_5 \end{bmatrix}$$
$$\tilde{A} \qquad \bar{x} \qquad \bar{s}$$

The redundancy scheme "2-out-of-5 redundancy" appears as follows in vector notation:

$$\begin{bmatrix} 1 & \\ & 1 \\ 1 & 1 \\ 2 & 1 \\ 1 & 2 \end{bmatrix} \cdot \begin{bmatrix} x_1 \\ x_2 \end{bmatrix} = \begin{bmatrix} s_1 \\ s_2 \\ s_3 \\ s_4 \\ s_5 \end{bmatrix}$$
$$\tilde{A} \qquad \bar{x} \qquad \bar{s}$$

The redundancy scheme "1-out-of-5 redundancy" (full redundancy) appears as follows in vector notation:

$$\begin{bmatrix} 1 \\ 1 \\ 1 \\ 1 \\ 1 \end{bmatrix} \cdot [x_1] = \begin{bmatrix} s_1 \\ s_2 \\ s_3 \\ s_4 \\ s_5 \end{bmatrix}$$
$$\tilde{A} \qquad \bar{x} \qquad \bar{s}$$

With the aid of this vector and matrix notation, it is possible to formulate conditions in order that the signals can be correspondingly reconstructed:

If consideration is given to the redundancy scheme "n-out-of-N redundancy", wherein $n \geq 1$ and $n \leq N$, then the following must hold true for the matrix $\tilde{A}$:
1. The matrix $\tilde{A}$ has N rows and n columns, and
2. n arbitrarily selected rows in the matrix $\tilde{A}$ must be linearly independent with respect to one another.

These conditions can be understood as a construction specification for constructing matrices $\tilde{A}$ for redundancy schemes "n-out-of-N redundancy".

In the simplest case, an N×n matrix can be generated randomly, in which the condition 2. is then checked.

Furthermore, it is possible to systematize this process, beginning with an n×n unit matrix and then progressively constructing further rows which meet the condition 2. Examples were shown above for n=1, 2, . . . , 5 and N=5.

Besides the abovementioned conditions regarding reconstructability, further boundary conditions may be necessary or expedient, e.g. that the sum of the coefficients a1, a2, . . . , an is equal to one for all rows in $\tilde{A}$, in order thus to ensure that all channels have an amplitude of constantly equal magnitude for the transmission. See also the example for N=3, in which this is satisfied.

A desired optimum decoding of the signals in the calculation module depends on multiple factors:
Type of symbols in the source signal
Type of symbols which are transmitted via the N channels
Statistics of the source signal (uniform distribution, Gaussian distribution, etc.)
Type of transmission channel (AWGN, binary, discrete, etc.)
Relevant criterion for the reproduction fidelity of the decoding (MSE, error probability, etc.)

For an optimized decoder design for combining the signals, there are some known methods:
Conditional Mean Estimation (CME)—Conditional expected value
For the redundancy scheme "no redundancy", with an assumed mean squared error it can be shown that the optimum individual decoder for individual signals reads as follows:

$\hat{x}_1 = E\{x_1|y_1\}$, $\hat{x}_2 = E\{x_2|y_2\}$, . . . , $\hat{x}_N = E\{x_N|y_N\}$, wherein $E\{a|b\}$ is the conditional expected value of b.

For the redundancy scheme "full redundancy", with an assumed mean squared error it can be shown that the optimum individual decoder for individual signals reads as follows:
$\hat{x}_1 = E\{x_1|y_1, y_2, \ldots, y_N\}$, wherein $E\{a|b\}$ is the conditional expected value of b.

For the redundancy scheme "n-out-of-N redundancy", with an assumed mean squared error it can be shown that the optimum individual decoder for individual signals reads as follows:
$\hat{x}_1 = E\{x_1|y_1, y_2, \ldots, y_N\}$, $\hat{x}_2 = E\{x_2|y_1, y_2, \ldots, y_N\}$, . . . , $\hat{x}_n = E\{x_n|y_1, y_2, \ldots, y_N\}$, wherein $E\{a|b\}$ is the conditional expected value of b.

The conditional expected value functions with uniform and nonuniform source signal distributions, likewise with diverse types of channels and/or transmission symbols.

Disadvantages of the conditional expected value are the complexity when N is large and the problem that the source and channel probabilities either have to be known or at least have to be estimated well.

Figure 4:
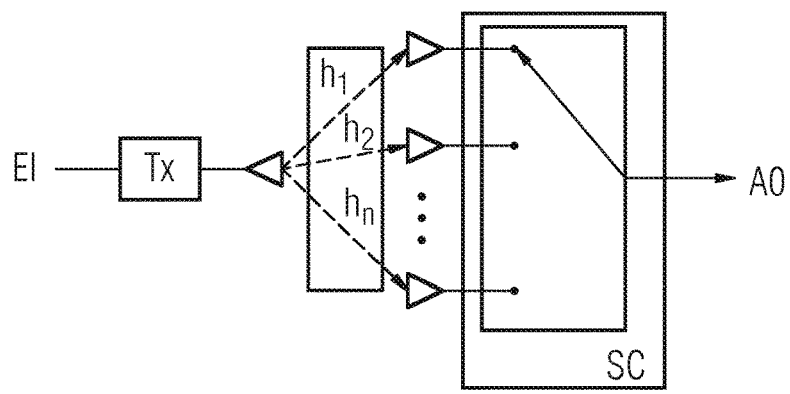
FIG. 4 shows a schematic figure for illustrating the selection of reception signals (selection combining, SC)

FIG. 4 shows a schematic diagram of the selection of reception signals (Selection Combining/SC) as an alternative to calculating the conditional expected value. In this case, the selection of the reception signal can be carried out according to multiple criteria. In a non-limiting embodiment, the decision can be taken on the basis of the signal strength or the signal-to-noise ratio of the reception signals.

The input signal at the input EI is divided into a plurality of branches h1, h2, . . . , hn and emitted. In the receiver there is a selection module SC, which always uses the channel having the largest signal-to-noise ratio. This signal is then output as output signal at the output AO.

The system model reads: y=hx+ξ

It is easy to check that the selection of reception signals functions only with full redundancy of the transmitted signals.

Figure 5:
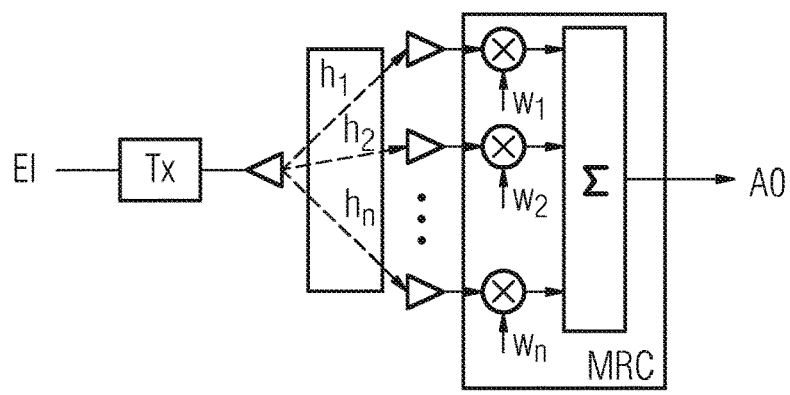
FIG. 5 shows a schematic figure for illustrating the constructive combining of reception signals (maximum ratio combining (MRC))

FIG. 5 shows a further method of combining reception signals. The "maximum-ratio combining" method (MRC) is illustrated here. This method combines the signal streams in a weighted manner according to their signal-to-noise ratio. The weighting factor of the individual signal is proportional to its signal-to-noise ratio. The individual signal streams and/or channels or branches are combined linearly in a coherent manner, specifically in such a way that the signal-to-noise ratio of the output signal is maximal.

At the input EI once again an input signal stream is input into the transmission unit Tx. Said input signal stream is once again divided into individual signal streams or branches h1, h2, . . . , hn and transmitted. In the receiver there is an MRC unit, which combines the individual signal streams again to form an output signal stream according to the "maximum-ratio combining" method. Said output signal stream is then once again output at the output AO.

This scheme is suitable for the 1-out-of-N redundancy scheme.

A further relevant method of combining reception signals is so-called "equal gain combining", or EGC for short. In this method, the available signals are simply added.

This method can be used for the n-out-of-N redundancy scheme by virtue of the n strongest signals being used for the solution of the linear equations.

In order to find the best method of combining reception signals for a given redundancy scheme, generally it will be necessary to find a compromise between the performance and the complexity of the method applied to the redundancy scheme.

MRC, for example, is difficult to implement, but in return yields the best results. Simpler methods such as SC yield poorer results, but are easier to implement. Methods such as ECG lie between these extremes.

The determination of an optimum decoder design will be explained below on the basis of an example.

The example shall employ N=3 channels. The latter can be e.g. light-based channels in the colors red, green and blue. RGB LEDs are in widespread use and can be used for these three totally independent channels.

A redundancy scheme with mean "2-out-of-3" redundancy is used. Therefore, the input signal is split between two signal streams x1, x2. The following signals are then transmitted via the three channels:

Channel 1: signal stream x1
Channel 2: signal stream x2
Channel 3: x1+2=x1+x2

The corresponding channel outputs thus read: y1, y2, y1+2.

A conditional expected value (CME) shall be used as a reproduction criterion for the mean squared error.

Figure 6:
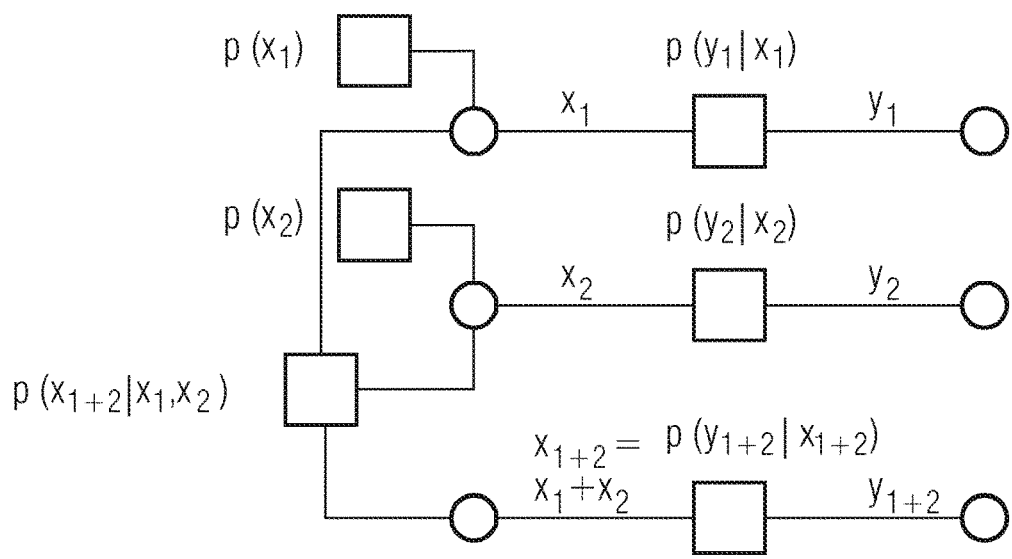
FIG. 6 shows a graphical representation of the probability-theoretical relationships of an example with N=3 channels.

FIG. 6 shows the graphical representation of the probability-theoretical relationships.

The decoding rule for the conditional expected value then reads:

$$\hat{x}_1 = E\{x_1 \mid y_1, y_2, y_{1+2}\} = \int_{-\infty}^{\infty} x_1 p\{x_1 \mid y_1, y_2, y_{1+2}\} dx_1$$

The conditional probabilities required for calculation can be described as follows:

$$p(x_1 = v \mid y_1 = w_1, y_2 = w_2, y_{1+2} = w_{1+2}) =$$
$$y \sum_{\forall x, x_1, x_{1+2} + x_i = v} p(y_1 = w_1, y_2 = w_2, y_{1+2} = w_{1+2} \mid x_1, x_2, x_{1+2}) p(x_1, x_2, x_{1+2})$$

Assuming independent transmission channels, the following holds true:

I.: $p(y_1=w_1, y_2=w_2, y_{1+2}=w_{1+2} \mid x_1, x_2, x_{1+2}) = p(y_1=w_1 \mid x_1) p(y_2=w_2 \mid x_2) p(y_{1+2}=w_{1+2} \mid x_{1+2})$ Furthermore, the partial data streams can generally be assumed to be independent; therefore, the following holds true:

II.: $p(x_1, x_2, x_{1+2}) = p(x_{1+2} \mid x_1, x_2) p(x_1, x_2) = p(x_{1+2} \mid x_1, x_2) p(x_1) p(x_2)$ In this case, on account of the deterministic relationship between x1, x2 and x1+2, it holds true that:

III.:

$$p(x_{1+2} \mid x_1, x_2) = \begin{cases} 1; & \text{if } x_{1+2}(x_1 + x_2) = j \\ 0; & \text{otherwise} \end{cases}$$

I., II. and III. yield the following for the conditional probability:

$$p(x_1 = v \mid y_1 = w_1, y_2 = w_2, y_{1+2} = w_{1+2}) = \gamma p(x_1 = v) p(y_1 = w \mid x_1 = v)$$
$$p(y_1 = w \mid x_1 = v)$$
$$\sum_{\forall x_2} p(x_2) p(y_2 = w_2 \mid x_2) \sum_{\forall x_{1+2}} p(x_{1+2} \mid x_1 = u, x_2) p(y_{1+2} = w_{1+2} \mid x_{1+2}) =$$
$$\gamma p(x_1 = v) p(y_1 = w \mid x_1 = v)$$
$$\sum_{\forall x_2} p(x_2) p(y_2 = w_2 \mid x_2) p(y_{1+2} = w_{1+2} \mid x_{1+2} = v + x_2)$$

Result:

$$\hat{x}_1 = E\{x_1 \mid y_1 = w_1, y_2 = w_2, y_{1+2} = w_{1+2}\} =$$
$$\sum_{\forall x_1} x_1 p(x_1 \mid y_1 = w_1, y_2 = w_2, y_{1+2} = w_{1+2}) = \sum_{\forall x_1} x_1 \gamma p(x_1)$$
$$p(y_1 = w_1 \mid x_1) \sum_{\forall x_2} p(x_2) p(y_2 = w_2 \mid x_2) p(y_{1+2} = w_{1+2} \mid x_{1+2} = x_1 + x_2)$$

These calculations can, of course likewise be carried out for x2 or any conceivable independent linear combination a1*x1+a2*x2.

An iterative graph-based decoding on the basis of the statistical relationships shown in FIG. 6 is also possible.

Figure 7:
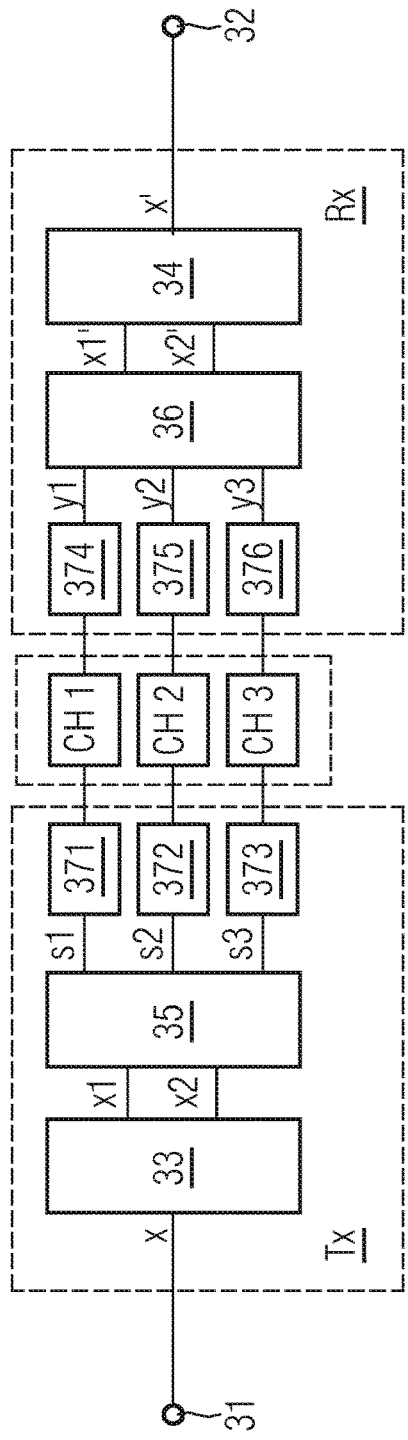
FIG. 7 shows a first embodiment of a system for linear encoding of signals for the redundant transmission of data via multiple channels.

FIG. 7 then shows a first embodiment of a system for linear encoding of signals for the redundant transmission of data via multiple channels, two partial data streams being transmitted via three channels in this example.

Otherwise, the functioning is similar to that in FIG. 3, for which reason the explanations for FIG. 3 are likewise substantially applicable here.

A signal is input into the input 31 of a transmission module Tx of the system and is split into two partial data streams x1 and x2 in a demultiplexer. These transmitter-end partial data streams x1 and x2 are then input into a redundancy function module 35, which converts these two partial data streams x1, x2 into three channel signals s1, s2, s3. The latter are input into a respective transmission transducer 371, 372, 373 and emitted via a respective channel Ch1, Ch2, Ch3.

In a reception module Rx, each channel is then received in a respective reception transducer 374, 375, 376 and input as receiver-end channel signal y1, y2, y3 into a calculation module 36. Here, two reception-end partial data streams x1', x2' are reconstructed again from the three received signals and are input into a multiplexer 34, which constructs the signal x' again therefrom, which signal is identical to the original signal x in the ideal case (i.e. in the case of error-free reception of two or three channel signals). This signal is output at the output 32 of the reception module Rx.

Figure 8:
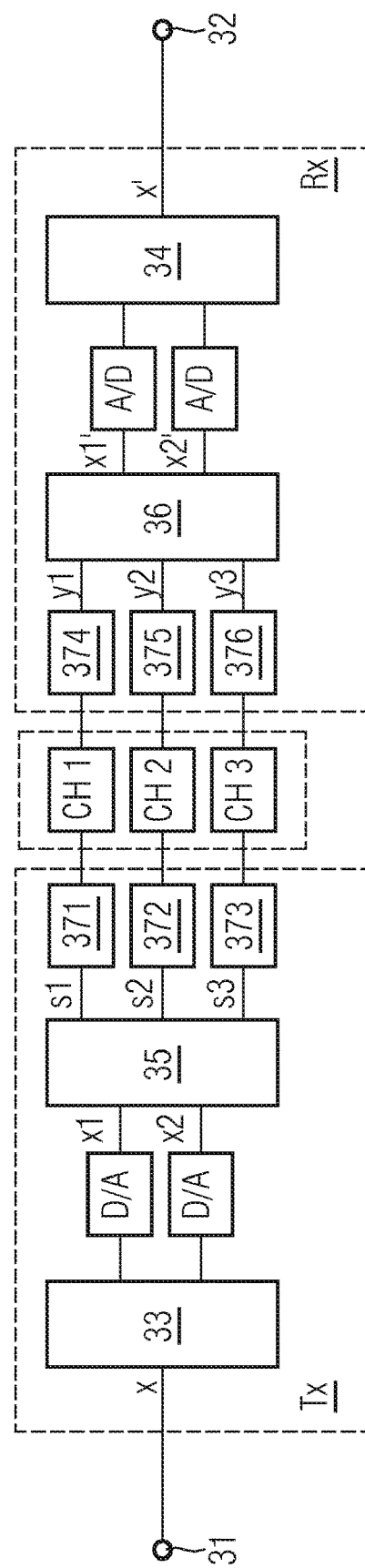
FIG. 8 shows a second embodiment of a system for linear encoding of signals for the redundant transmission of data via multiple channels.

FIG. 8 shows a second embodiment of a system for linear encoding of signals for the redundant transmission of data via multiple channels, two partial data streams likewise being transmitted via three channels in this example.

In contrast to the first embodiment, in the second embodiment, the redundancy function is applied to the analog signal, that is to say that the redundancy function module 35 is provided in the signal path actually downstream of the digital-to-analog conversion.

Otherwise, the arrangement is identical to that in FIG. 7, for which reason the function will not be described again here.

Figure 9:
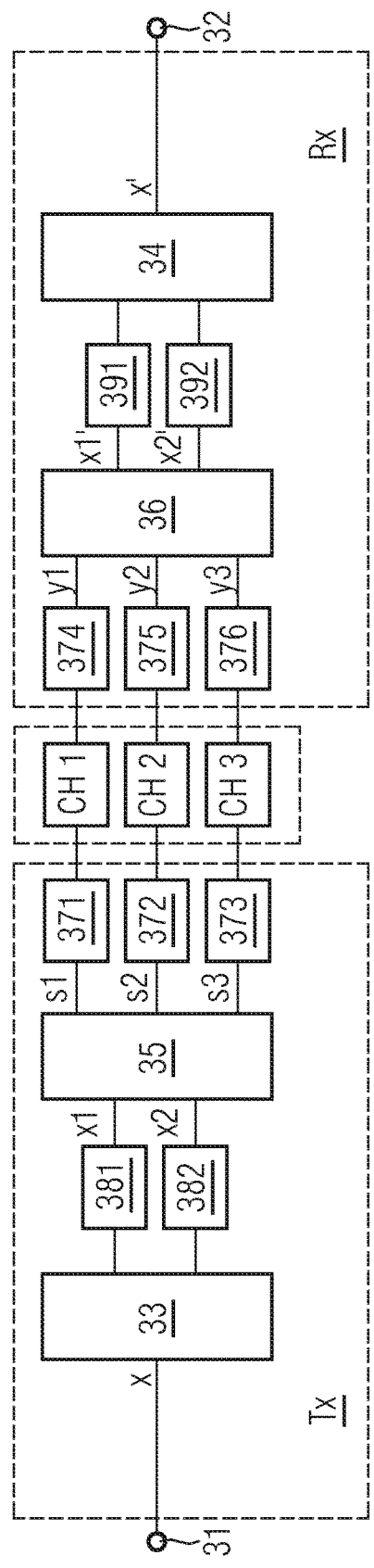
FIG. 9 shows a third embodiment of a system for linear encoding of signals for the redundant transmission of data via multiple channels.

FIG. 9 shows a third embodiment of a system for linear encoding of signals for the redundant transmission of data via multiple channels. In the third embodiment there are two transmission converters 381, 382 arranged downstream of the demultiplexer. The signals x1 and x2 generated by the transmission converters 381, 382 are input into a redundancy function module 35, where they are converted into three transmission-end channel signals s1, s2, s3. These three signals are then input into a respective transmission transducer 371, 372, 373, where in this embodiment they are first of all subjected to digital-to-analog conversion in order then to be emitted via a respective channel Ch1, Ch2, Ch3.

At the receiver end, per channel they are then received in a respective reception transducer 374, 375, 376, subjected to analog-to-digital conversion and input as receiver-end channel signal y1, y2, y3 into a calculation module 36. Here, two reception-end partial data streams x1', x2' are constituted again from the three received signals and are then input in a first and second reception converter 391, 392. The latter converts the signals and inputs them into a multiplexer 34, which reconstructs the signal x' again therefrom. This signal is then output at the output 32.

Figure 10:
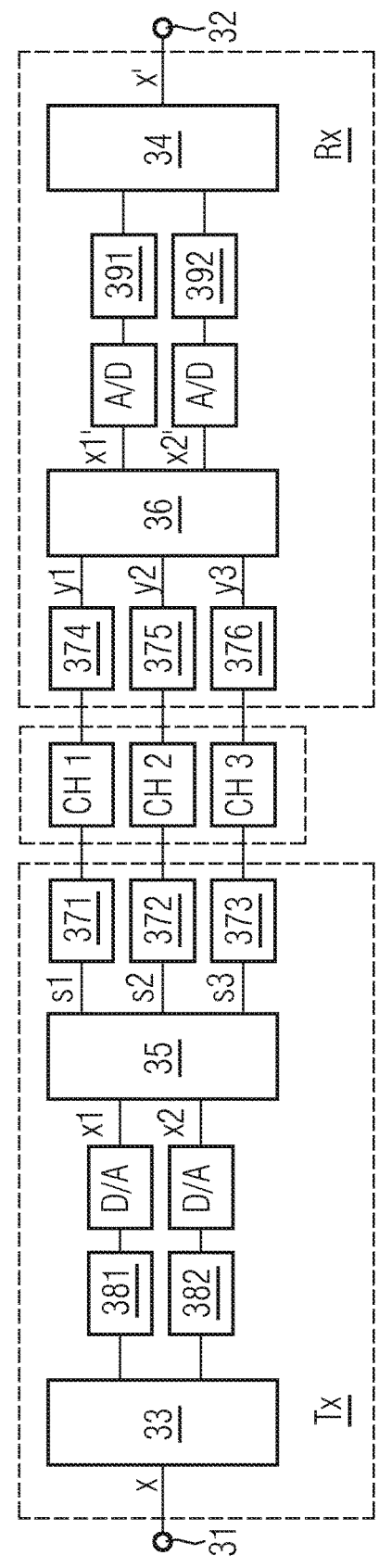
FIG. 10 shows a fourth embodiment of a system for linear encoding of signals for the redundant transmission of data via multiple channels.

FIG. 10 shows a fourth embodiment of a system for linear encoding of signals for the redundant transmission of data via multiple channels.

In the fourth embodiment, the data are subjected to digital-to-analog conversion upstream of the redundancy function module 35. The redundancy function module 35 thus processes analog data streams, in contrast to the third embodiment. As in the other embodiments, the data stream is input into the input 31 and is split into two partial data streams by the demultiplexer 33, said partial data streams once again being converted in two transmission converters 381, 382. The two partial data streams are then converted into two analog partial data streams x1 and x2 in two digital-to-analog converters. Said analog partial data streams are then converted into three transmission-end channel signals s1, s2, s3 in a redundancy function module 35, said channel signals then being transmitted in a respective transmission transducer 371, 372, 373 via a respective channel Ch1, Ch2, Ch3.

Said channel signals are received in three reception transducers 374, 375, 376 and input into a calculation module 36. The latter once again calculates the receiver-end partial data streams x1', x2' from the three reception-end channel signals y1, y2, y3. Said receiver-end partial data streams are then converted into digital data streams again in a respective analog-to-digital converter and converted in a respective reception converter and input into a multiplexer 34, which reconstructs the signal x' again therefrom and outputs it at the output 32.

Transmission of bipolar signals via unipolar channels.

For wireless optical communication it is often necessary to transmit bipolar signals in a digital data stream via unipolar channels using light as a medium. This is the case e.g. for so-called "Intensity Modulation/Direct Detection" (IM/DD), which is favored owing to its simplicity and cost-effectiveness. Here the signals must have a real value and be positive.

Specifically for wireless optical communication there are adapted OFDM variants for IM/DD, which are very relevant. In order to obtain real-valued signals, the Hermitian symmetry is usually constrained in the fast Fourier transformation (FFT).

There are various approaches for obtaining positive or unipolar signals:
1. DCO-OFDM (DC offset OFDM): Here a bipolar OFDM signal is taken and a DC offset is added, a unipolar signal thus being present as a result.
   Advantage: Simplicity
   Disadvantage: The DC offset is dependent on the PAPR (Peak to Average Power Ratio), which is very large for OFDM symbols. This means that the DC offset has to be very large, which adversely affects efficiency.
2. ACO-OFDM (Asymmetrically Clipped OFDM): Transmitter-end clipping of the negative signal components.
   Advantage: Good power efficiency
   Disadvantage: High receiver-end hardware complexity in the decoder
3. Flip-OFDM: Positive and negative signal components are extracted from the real value signal; the negative signal components are inverted and both parts are transmitted as a unipolar signal.
   Advantage: Good power efficiency similar to ACO-OFDM, but less receiver/decoder complexity.
   Disadvantage: Potentially susceptible to very rapidly varying signals since both unipolar components are transmitted directly in succession.

The following assumptions may be made for wireless transmission of information using light (OWC):
   The OWC channel is highly time-variable, particularly in mobile scenarios
   The time-variable characteristic of the channel is problematic, particularly for signal components of the same signal which are transmitted in succession via the channel (e.g. Flip-OFDM)
   Apart from that, light-based communication is generally demanding: direct line of sight may be necessary, but cannot be guaranteed in many cases. Signals that are not received via a direct line of sight normally have a poor signal quality/poor signal-to-noise ratio.

Furthermore, it may be established that the RGB transmitter with its three orthogonal channels is relevant to light-based communication.

In order to improve the methods known from the prior art, it is then proposed to split a bipolar signal into its positive and negative components and to transmit only positive linear combinations of these signal components separately via channels.

In order to compensate for the time-variable characteristic, it is proposed to construct linear combinations of the signal components with additional redundancy and to send them in succession via the channel. The linear combinations are fashioned in such a way that they can compensate for the channel dropouts during some time slots. The linear combinations can be constructed in a manner similar to that explained above for FIG. 3 et seq.

In order to compensate for poor signal-to-noise ratio of light-based communication, it is proposed to emit the constructed linear combinations with additional redundancy via multiple channels simultaneously. Thus, as described in respect of FIG. 3, a significantly better signal quality can then be achieved.

Seven similar embodiments are described below, which can ensure a good signal quality in conjunction with manageable complexity.

Figure 11:
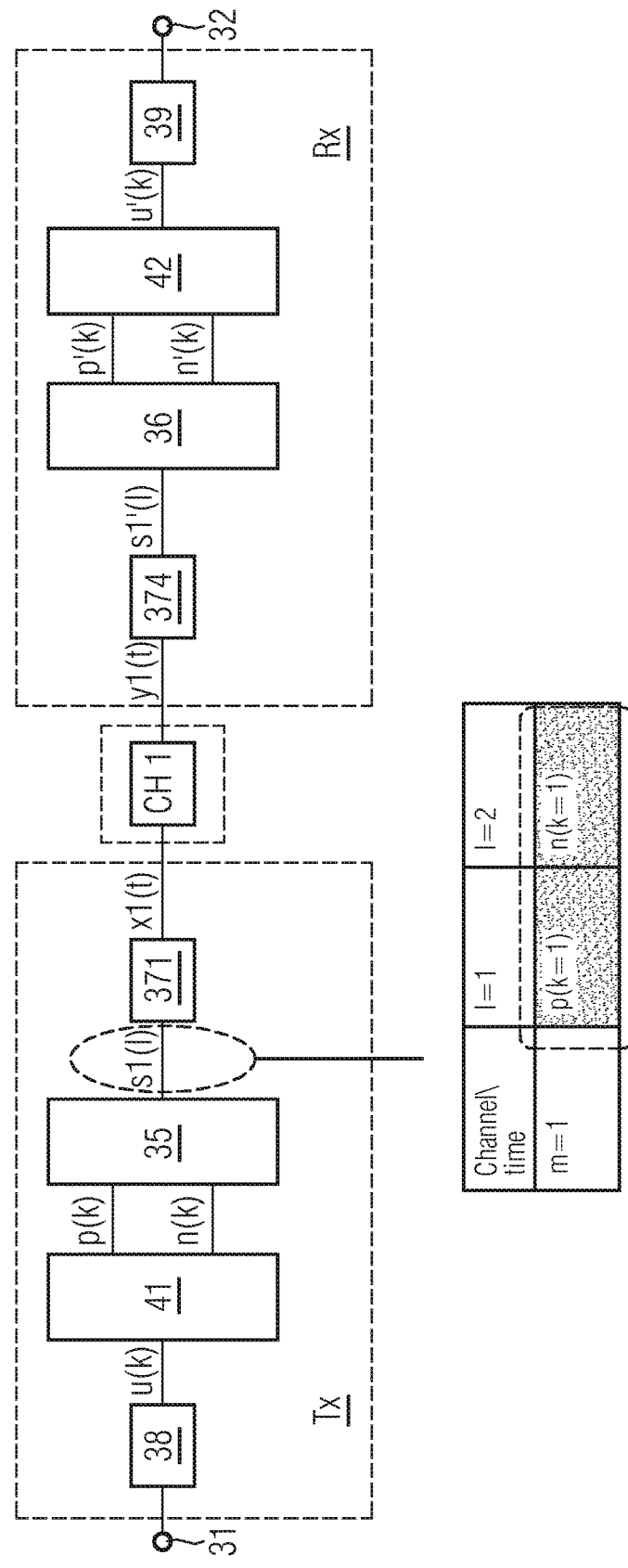
FIG. 11 shows a first embodiment of the transmission of bipolar signals via unipolar channels, wherein one symbol is transmitted via one channel in two transmissions.

FIG. 11 shows a first embodiment of the transmission of bipolar signals via unipolar channels with a Flip-OFDM-like characteristic. In this embodiment, C=1 positive and C=1 negative components are transmitted via N=1 channel in L=2 transmissions.

The data stream is input into the input 31, where it is converted into a stream of bipolar data symbols u(k) by a transmission converter 38. K here is a sequential index of the source symbols. Said stream of bipolar data symbols u(k) is then input into a polarity separating module 41, in which the positive components are separated from the negative components of the bipolar signal, and the negative components are inverted, with the result that all the signal components are then unipolar-positive. The polarity separating module thus acts like a 1-to-2 demultiplexer. The positive signal components p(k) and the inverted negative signal components n(k) are then input into a redundancy function module 35. The latter forms, from the two parallel symbols of an index, two serial s1(I), which are first subjected to digital-to-analog conversion in succession by means of a transmission transducer 371 and then the resulting signal x1($t$) is transmitted via a channel Ch 1 in two transmissions I=1 and I=2. The index I here denotes the number of transmissions per symbol, in this case two.

Thus, for the index I=1 the symbol s1(I=1)=p(k=1) is transmitted, and for the index I=2 the symbol s1(I=2)=n(k=1) is transmitted. The index I is likewise a sequential index which is simply incremented.

At the receiver end, the signal y1($t$) transmitted via the channel Ch 1 is received in a reception converter 374, subjected to analog-to-digital conversion and then input as signal s1'(I) into a calculation module 36, which reconstructs two signal components p'(k) and n'(k) again from the signal s1'($t$). These two signal components p'(k) and n'(k) are then input into a polarity reconstruction module 42, which constructs a bipolar signal u'(k) from the two unipolar signal components p'(k) and n'(k) and outputs it to a reception converter 39. The latter then converts the signal into the original data stream again and outputs it at the output 32. The polarity reconstruction module 42 thus operates like a 2-to-1 multiplexer.

As can easily be established, there is no redundancy in this example. If the transmission channel drops out for a short time, then the source signal can no longer be completely reconstructed. As soon as a signal component of a symbol can no longer be received owing to channel dropout, this symbol is lost and cannot be reconstructed again.

In principle, the transmission symbols s1(I) and s1(I+1) can represent any linear combination of the positive p(k) and negative n(k) signal components:

$$s1(1,I)=a1(1,I)*p(k)+a2(1,I)*n(k)$$

s1(1,I+1)=a1 (I+1)*p(k)+a2(1,I+1)*n(k), wherein a1( ) and a2( ) are coefficients which were selected in such a way that a1( )>0 and a2( )>0 and a1( )+a2( )=1. This ensures that the signal is positive, and the amplitude is uniform over time.

In this specific example, the coefficients are selected as follows:

$$a1(1,I)=1;\ a2(1,I)=0;$$

$$a1(1,I+1)=0;\ a2(1,I+1)=1$$

Figure 12:
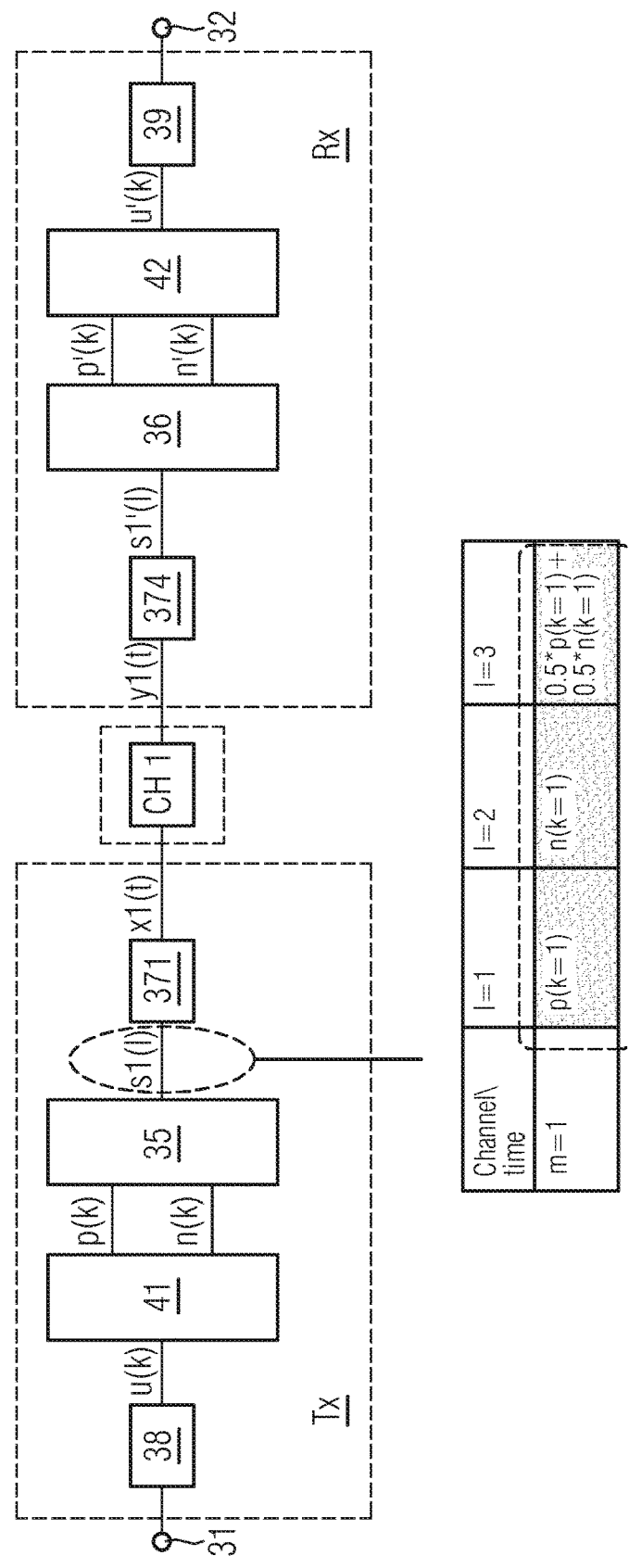
FIG. 12 shows a second embodiment of the transmission of bipolar signals via unipolar channels, wherein one symbol is transmitted via one channel in three transmissions with redundancy in the third transmission.

FIG. 12 shows a second embodiment, which is similar to the first embodiment. In this embodiment, C=1 positive and C=1 negative components are transmitted via N=1 channel in L=3 transmissions. In contrast to the first embodiment, the third transmission adds redundancy in order to increase the transmission reliability.

The data stream is input into the input 31, where it is converted into a stream of bipolar data symbols u(k) by a transmission converter 38. K here is a sequential index of the source symbols. Said stream of bipolar data symbols u(k) is then input into a polarity separating module 41, in which the positive components are separated from the negative components of the bipolar signal, and the negative components are inverted, with the result that all the signal components are then unipolar-positive. The positive signal components p(k) and the inverted negative signal components n(k) are then input into a redundancy function module 35. The latter forms, from the two parallel symbols of an index, three serial s1(I), which are first subjected to digital-to-analog conversion in succession by means of a transmission transducer 371 and then the resulting signal x1($t$) is transmitted via a channel Ch 1 in three transmissions I=1, I=2 and I=3. The index I here denotes the number of transmissions per symbol, in this case three. In this case, the two signal components per se are transmitted in the first and second transmissions, and in the third transmission a linear combination of the two signal components is transmitted for additional redundancy.

Thus, the symbol s1(I)=p(k) is transmitted for the index I, and the symbol s1(I+1)=n(k) is transmitted for the index I+1. In addition, the symbol p(k)+n(k) is transmitted for the index I+2. As in the first embodiment, the index I is a sequential index that is simply incremented.

At the receiver end, the signal y1($t$) transmitted via the channel Ch 1 is received in a reception converter 374, subjected to analog-to-digital conversion and then input as signal s1'(I) into a calculation module 36, which reconstructs two signal components p'(k) and n'(k) again from the signal s1'($t$). These two signal components p'(k) and n'(k) are then input into a polarity reconstruction module 42, which constructs a bipolar signal u'(k) from the two unipolar signal components p'(k) and n'(k) and outputs it to a reception converter 39. The latter then converts the signal into the original data stream again and outputs it at the output 32.

As a result of the third transmission, there is a certain redundancy in this second embodiment, with the result that, in the event of momentary channel dropouts, the original symbol u(k) can nevertheless be reconstructed:

$$s1(I)=p(k)$$

$$s1(I+1)=n(k)$$

$$s1(I+2)=p(k)+n(k)$$

In this specific example, the coefficients were selected as follows:

$$a1(1,I)=1;\ a2(1,I)=0;$$

$$a1(1,I+1)=0;\ a2(1,I+1)=1$$

$$a1(1,I+2)=0.5;\ a2(1,I+2)=0.5$$

An advantage of this embodiment is that one of the transmitted symbols may be lost, and the original symbol can nevertheless be reconstructed again from the two remaining transmission symbols.

Thus, for example, if the transmission symbol s1(I+1) is lost owing to a momentary channel dropout, the positive component p(k)=s1(I) and the negative component n(k)=s1(I+2)−s1(I) can nevertheless be reconstructed.

This corresponds to a "2-out-of-3 redundancy scheme" with regard to the transmissions.

Figure 13:
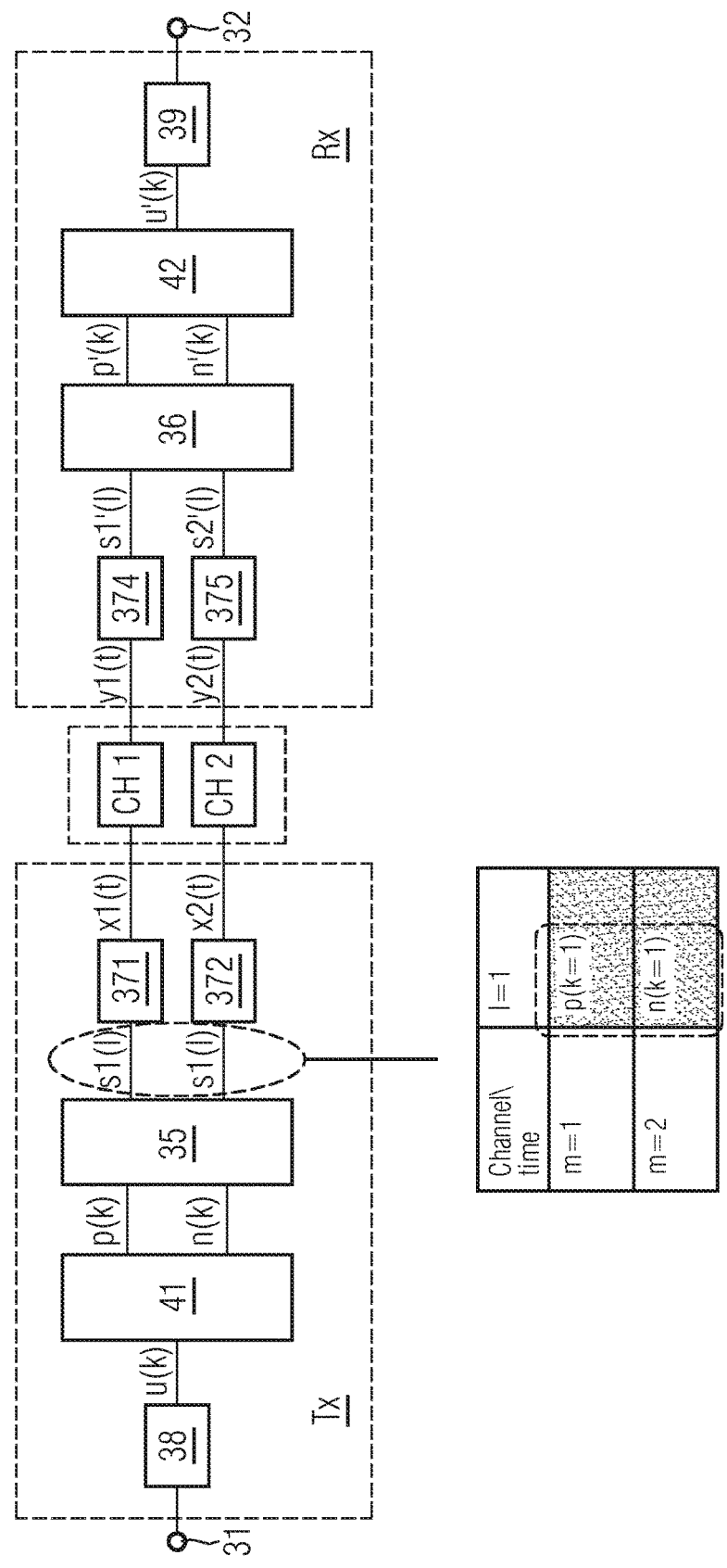
FIG. 13 shows a third embodiment of the transmission of bipolar signals via unipolar channels, wherein one symbol is transmitted via two channels in one transmission without redundancy.

FIG. 13 shows a third embodiment. In this embodiment, C=1 positive and C=1 negative components are transmitted via N=2 channels in L=1 transmission.

The data stream is input into the input 31, where it is converted into a stream of bipolar data symbols u(k) by a transmission converter 38. K here is a sequential index of the source symbols. Said stream of bipolar data symbols u(k) is then input into a polarity separating module 41, in which the positive components are separated from the negative components of the bipolar signal, and the negative components are inverted, with the result that all the signal components are then unipolar-positive. The positive signal components p(k) and the inverted negative signal components n(k) are then input into a redundancy function module 35. The latter forms, from the two parallel symbols of an index, two parallel s1(I) and s2(I), which are first subjected to digital-to-analog conversion by means of a respective transmission transducer 371, 372 and then the resulting signals x1(*t*) and x2(*t*) are transmitted in parallel via a respective channel Ch 1 and Ch 2 in one transmission I=1. The index I here denotes the number of transmissions per symbol, in this case one.

Thus, for the index I=1, the symbol s1(I=1)=p(k=1) and the symbol s2(I=1)=n(k=1) are transmitted simultaneously by means of the signals x1(*t*) and x2(*t*). The index I is likewise a sequential index that is simply incremented.

At the receiving end, the signals y1(*t*) and y2(*t*) transmitted via the channels Ch 1 and Ch 2 are received in a respective reception transducer 374, 375, subjected to analog-to-digital conversion and then input as signals s1'(I) and s2'(I) into a calculation module 36, which reconstructs two signal components p'(k) and n'(k) again from the signals s1'(I) and s2'(I). These two signal components p'(k) and n'(k) are then input into a polarity reconstruction module 42, which constructs a bipolar signal u'(k) from the two unipolar signal components p'(k) and n'(k) and outputs it to a reception converter 39. The latter then converts the signal into the original data stream again and outputs it at the output 32.

As a result of the parallel transmission in one step, a lower latency during the transmission should be recorded here. The transmission symbols in this example are selected as follows:

$$s1(I)=p(k) \qquad \text{Channel 1:}$$

$$s2(I)=n(k) \qquad \text{Channel 2:}$$

As can easily be established, there is no redundancy in this example. If just one of the two transmission channels drops out for a short time, then the source signal can no longer be completely reconstructed. As soon as a signal component of a symbol can no longer be received owing to channel dropout, this symbol is lost and cannot be reconstructed again.

The transmission symbols s1(I) and s2(I) can represent any linear combination of the positive p(k) and negative n(k) signal components:

$$s1(I)=a1(1,I)*p(k)+a2(1,I)*n(k)$$

s2(I)=a1(2,I)*p(k)+a2(2,I)*n(k), wherein a1( ) and a2( ) are coefficients which were selected in such a way that a1( )<0 and a2( )<0 and a1( )+a2( )=1. This ensures that the signal is positive, and the amplitude is uniform over time.

In this specific example, the coefficients are selected as follows:

$$a1(1,I)=1;\ a2(1,I)=0;$$

$$a1(2,I)=0;\ a2(2,I)=1$$

Figure 14:
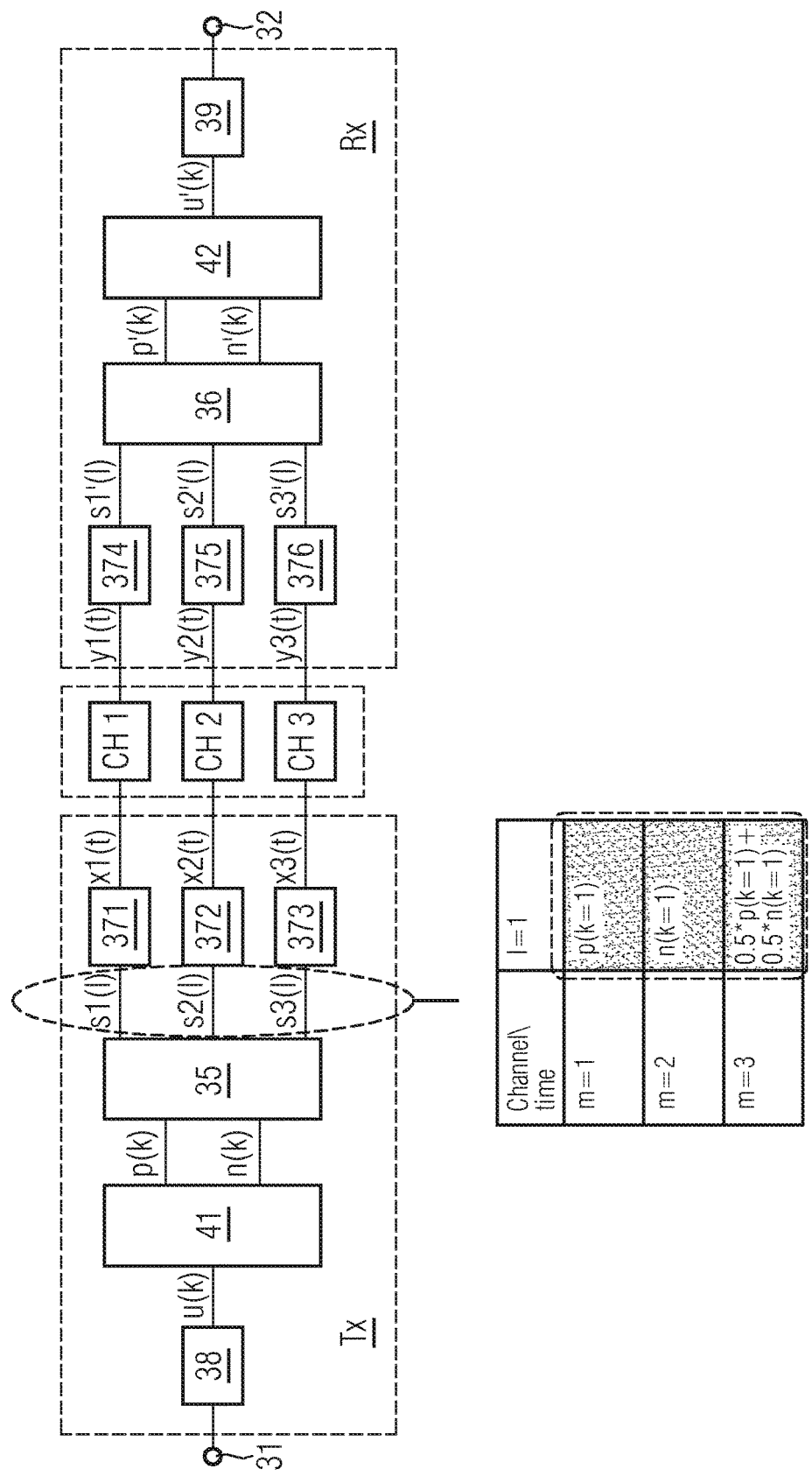
FIG. 14 shows a fourth embodiment of the transmission of bipolar signals via unipolar channels, wherein one symbol is transmitted via three channels in one transmission with redundancy in the third channel.

FIG. 14 shows a fourth embodiment, which is similar to the second embodiment. In this embodiment, C=1 positive and C=1 negative components are transmitted via N=3 channels in L=1 transmission. The third channel adds redundancy in order to increase the transmission reliability.

The data stream is input into the input 31, where it is converted into a stream of bipolar data symbols u(k) by a transmission converter 38. K here is a sequential index of the source symbols. Said stream of bipolar data symbols u(k) is then input into a polarity separating module 41, in which the positive components are separated from the negative components of the bipolar signal, and the negative components are inverted, with the result that all the signal components are then unipolar-positive. The positive signal components p(k) and the inverted negative signal components n(k) are then input into a redundancy function module 35. The latter forms, from the two parallel symbols of an index, three parallel s1(I), s2(I) and s3(I), which are first subjected to digital-to-analog conversion in parallel by means of a respective transmission transducer 371, 372, 373 and then the resulting signals x1(*t*), x2(*t*) and x3(*t*) are transmitted via a respective channel Ch 1, Ch 2, Ch 3 in one transmission I=1. The index I here denotes the number of transmissions per symbol, in this case one. Therefore, this example has a very good latency. In this case, the two signal components per se are transmitted on the first and second channels Ch 1, Ch 2, and on the third channel a linear combination of the two signal components is transmitted for additional redundancy.

Thus, for the index I, the symbol s1(I)=p(k), the symbol s2(I)=n(k) and additionally the symbol s3(I)=0.5*p(k)+0.5*n(k) are transmitted simultaneously. As in the first exemplary embodiment, the index I is a sequential index that is simply incremented. As a result of the parallel transmission, here one symbol per index is transmitted, which brings about a very good latency of the transmission.

At the receiver end, the signals y1(*t*), y2(*t*), y3(*t*) transmitted via the channels Ch 1, Ch 2, Ch 3 are received in a respective reception transducer 374, 375, 376, subjected to analog-to-digital conversion and then input as signals s1'(I), s2'(I), s3'(I) into a calculation module 36, which reconstructs two signal components p'(k) and n'(k) again from the signals s1'(I), s2'(I), s3'(I). These two signal components p'(k) and n'(k) are then input into a polarity reconstruction module 42, which constructs a bipolar signal u'(k) again from the two unipolar signal components p'(k) and n'(k) and outputs it to a reception converter 39. The latter then converts the signal into the original data stream again and outputs it at the output 32.

As a result of the third channel, there is a certain redundancy in this fourth embodiment, with the result that, in the event of momentary dropouts of an arbitrary channel, the original symbol u(k) can nevertheless be reconstructed:

$$s1(I)=p(k)$$

$$s2(I)=n(k)$$

$$s3(I)=p(k)+n(k)$$

In this specific example, the coefficients are selected as follows:

$$a1(1,I)=1;\ a2(1,I)=0;$$

$$a1(2,I)=0;\ a2(2,I)=1$$

$$a1(3,I)=0.5;\ a2(3,I)=0.5$$

An advantage of this embodiment is that one of the transmitted symbols may be lost, and the original symbol can nevertheless be reconstructed again from the two remaining transmission symbols. As a result of the parallel transmission of the symbols, the data throughput and the latency are improved by comparison with the second embodiment.

Thus, for example, if the transmission symbol s2(I) is lost owing to a momentary channel dropout, the positive component p(k)=s1(I) and the negative component n(k)=s3(I)−s1(I) can nevertheless be reconstructed.

This corresponds to a "2-out-of-3 redundancy scheme" with regard to the parallel channels.

Figure 15:
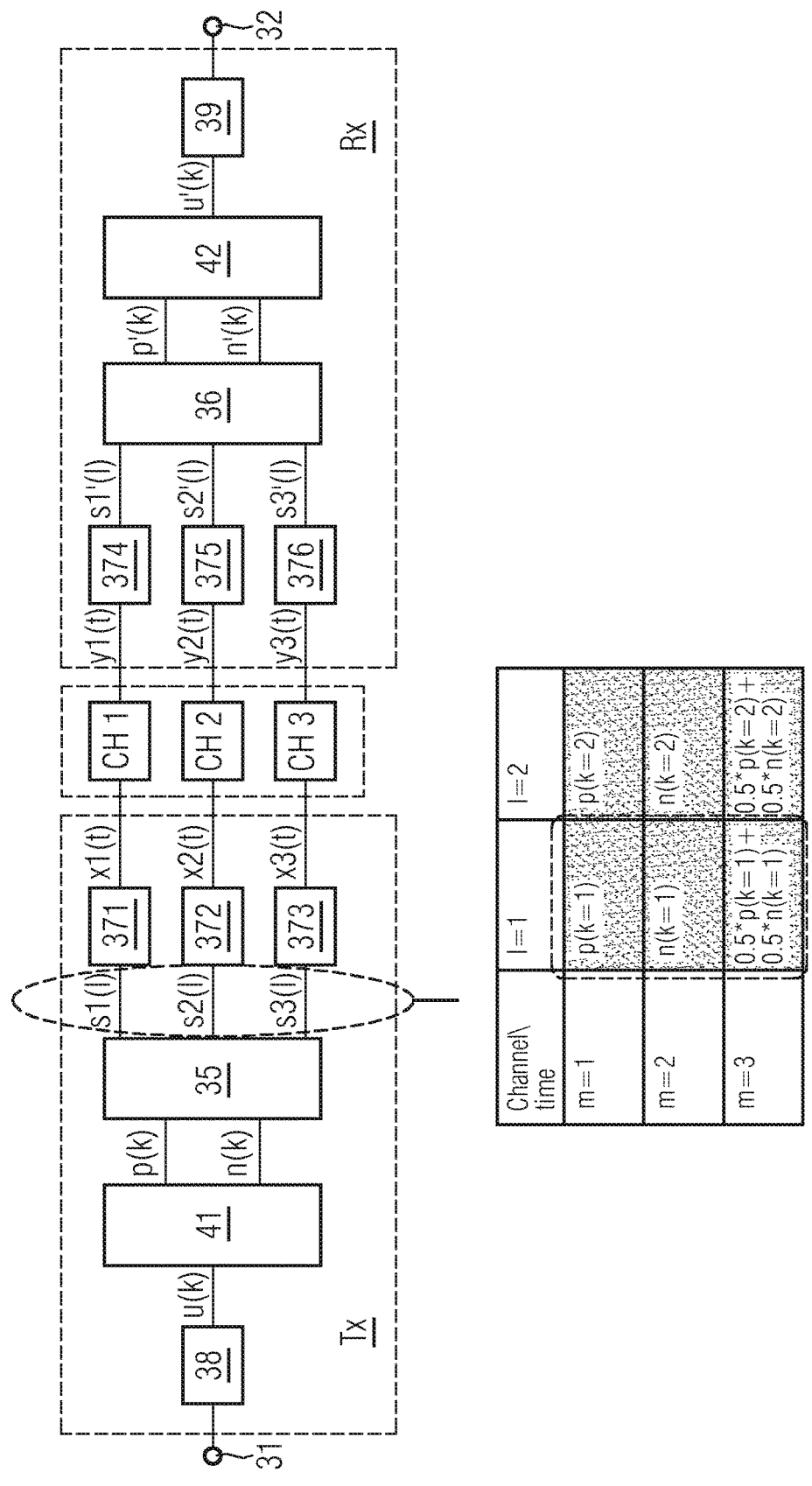
FIG. 15 shows a fifth embodiment, wherein here two symbols are transmitted in succession in two transmissions via three channels with redundancy in the third channel.

FIG. 15 shows a fifth embodiment, which is very similar to the fourth embodiment. In this embodiment, C=2 positive and C=2 negative components are transmitted via N=3 channels in L=2 transmissions. The third channel adds redundancy in order to increase the transmission reliability. In principle, this embodiment is the illustration of the fourth embodiment with a plurality of symbols. Here, by way of example, two symbols are transmitted in succession via three channels.

The data stream is once again input into the input 31, where it is converted into a stream of bipolar data symbols u(k) by a transmission converter 38. K here is a sequential index of the source symbols. Said stream of bipolar data symbols u(k) is then input into a polarity separating module 41, in which the positive components are separated from the negative components of the bipolar signal, and the negative components are inverted, with the result that all the signal components are then unipolar-positive. The positive signal components p(k) and the inverted negative signal components n(k) are then input into a redundancy function module 35. The latter forms, from the two parallel symbols of an index, three parallel s1(I), s2(I) and s3(I), which are first subjected to digital-to-analog conversion in parallel by means of a respective transmission transducer 371, 372, 373 and then the resulting signals x1(t), x2(t) and x3(t) are transmitted via a respective channel Ch 1, Ch 2, Ch 3 in a first transmission I=1. The index I here denotes the number of transmissions, in this case two, since two source symbols are intended to be transmitted. In this case, the two signal components per se are transmitted on the first and second channels Ch 1, Ch 2, and on the third channel a linear combination of the two signal components is transmitted for additional redundancy.

Thus, for an index I, the symbol s1(I)=p(k), the symbol s2(I)=n(k) and additionally the symbol s3(I)=0.5*p(k)+0.5*n(k) are transmitted simultaneously. As in the first exemplary embodiment, the index I is a sequential index that is simply incremented. As a result of the parallel transmission, here one symbol per index is transmitted, which brings about a very good latency of the transmission. In this example, two symbols are transmitted in succession with two indices I=1 and I=2.

At the receiver end, the signals y1(t), y2(t), y3(t) transmitted via the channels Ch 1, Ch 2, Ch 3 are received in a respective reception transducer 374, 375, 376, subjected to analog-to-digital conversion and then input as signals s1'(I), s2'(I), s3'(I) into a calculation module 36, which reconstructs two signal components p'(k) and n'(k) again from the signals s1'(I), s2'(I), s3'(I). These two signal components p'(k) and n'(k) are then input into a polarity reconstruction module 42, which constructs a bipolar signal u'(k) again from the two unipolar signal components p'(k) and n'(k) and outputs it to a reception converter 39. The latter then converts the signal into the original data stream again and outputs it at the output 32.

As a result of the third channel, there is a certain redundancy in this embodiment, with the result that, in the event of momentary channel dropouts, the original symbol u(k) can nevertheless be reconstructed:

$$s1(I)=p(k)$$

$$s2(I)=n(k)$$

$$s3(I)=p(k)+n(k)$$

and $$s1(I+1)=p(k+1)$$

$$s2(I+1)=n(k+1)$$

$$s3(I+1)=p(k+1)+n(k+1)$$

In this specific example, the coefficients are selected as follows:

$$a1(1,I)=1;\ a2(1,I)=0;$$

$$a1(2,I)=0;\ a2(2,I)=1$$

$$a1(3,I)=0.5;\ a2(3,I)=0.5$$

and $$a1(1,I+1)=1;\ a2(1,I+1)=0;$$

$$a1(2,I+1)=0;\ a2(2,I+1)=1$$

$$a1(3,I+1)=0.5;\ a2(3,I+1)=0.5$$

An advantage of this embodiment is that one of the transmitted symbols may be lost, and the original symbol can nevertheless be reconstructed again from the two remaining transmission symbols. As a result of the parallel transmission of the symbols, the data throughput and the latency are improved by comparison with the second embodiment.

Thus, for example, if the transmission symbol s2(I) is lost owing to a momentary channel dropout, the positive component p(k)=s1(I) and the negative component n(k)=s3(I)−s1(I) can nevertheless be reconstructed.

This once again corresponds to a "2-out-of-3 redundancy scheme" with regard to the parallel channels; there is no redundancy with regard to the transmissions.

Figure 16:
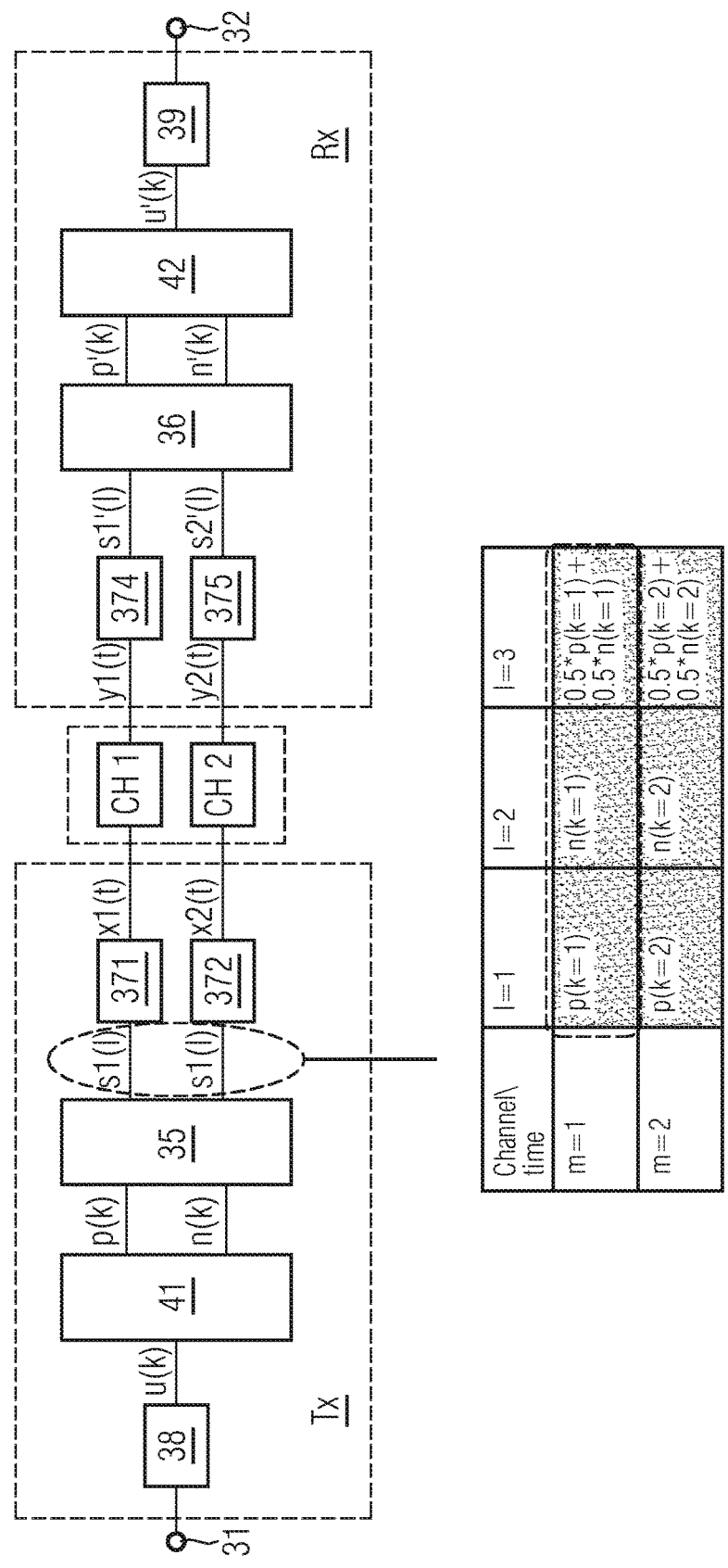
FIG. 16 shows a sixth embodiment, wherein here two symbols are transmitted in parallel via two channels in three transmissions with redundancy in the third transmission.

FIG. 16 shows a sixth embodiment, which is similar to the second embodiment. In this embodiment, C=2 positive and C=2 negative components are transmitted via N=2 channels in L=3 transmissions. The third transmission adds redundancy in order to increase the transmission reliability. In this embodiment, two symbols are simultaneously transmitted sequentially via two channels.

The data stream is input into the input 31, where it is converted into a stream of bipolar data symbols u(k) by a transmission converter 38. K here is a sequential index of the source symbols. Said stream of bipolar data symbols u(k) is then input into a polarity separating module 41, in which the positive components are separated from the negative components of the bipolar signal, and the negative components are inverted, with the result that all the signal components are then unipolar-positive. The positive signal components p(k) and the inverted negative signal components n(k) are then input into a redundancy function module 35. The latter forms, from the two parallel symbols of an index, three serial s1(I), which are first subjected to digital-to-analog conversion in succession by means of a transmission transducer 371 and then the resulting signal x1(t) is transmitted via a channel Ch 1 in three transmissions I=1, I=2 and I=3. At the same time, the redundancy function module 36 outputs three further serial indices for the following symbol, which is simultaneously converted to the signal x2(t) via the second transmission transducer 372 and is transmitted via the second channel Ch 2. The index I here denotes the number of transmissions per symbol, in this case three. In this case, the two signal components per se are transmitted in the first and second transmissions, and in the third transmission a linear combination of the two signal components is transmitted for additional redundancy.

Thus, on the first channel Ch 1, the symbol s1(I)=p(k) is transmitted for the index I, and the symbol s1(I+1)=n(k) is transmitted for the index I+1. The symbol p(k)+n(k) is additionally transmitted for the index I+3. At the same time, on the second channel, the symbol s2(I)=p(k+1) is transmitted for the index I, and the symbol s2(I+1)=n(k+1) is transmitted for the index I+1. The symbol p(k+1)+n(k+1) is additionally transmitted for the index I+3. As in the first exemplary embodiment, the index I is a sequential index that is simply incremented.

At the receiver end, the signal y1(t) and y2(t) transmitted via the channel Ch 1 and the channel Ch 2, respectively, is received in a reception transducer 374, subjected to analog-to-digital conversion and then input as signal s1'(I) and s2'(I), respectively, into a calculation module 36, which reconstructs two signal components p'(k) and n'(k) and p'(k+1) and n'(k+1) again from the signals s1'(t) and s2'(t). These two signal components p'(k) and n'(k) and respectively p'(k+1) and n'(k+1) are then input into a polarity reconstruction module 42, which constructs two bipolar signals u'(k), u'(k+1) from the unipolar signal components p'(k) and n'(k)/p'(k+1) and n'(k+1) and outputs them to a reception converter 39. The latter then converts the signal into the original data stream again and outputs the latter at the output 32.

As a result of the third transmission, there is a certain redundancy in this sixth embodiment, with the result that, in the event of momentary channel dropouts, the original symbol u(k) can nevertheless be reconstructed:

$$s1(I)=p(k)$$

$$s1(I+1)=n(k)$$

$$s1(I+2)=p(k)+n(k)$$

and respectively $$s2(I)=p(k+1)$$

$$s2(I+1)=n(k+1)$$

$$s2(I+2)=p(k+1)+n(k+1)$$

In this specific example, the coefficients are selected as follows:

$$a1(1,I)=1;\ a2(1,I)=0;$$

$$a1(1,I+1)=0;\ a2(1,I+1)=1$$

$$a1(1,I+2)=0.5;\ a2(1,I+2)=0.5$$

An advantage of this embodiment is that one of the transmitted symbols may be lost, and the original symbol can nevertheless be reconstructed again from the two remaining transmission symbols.

Thus, for example, if the transmission symbol s1(I+1) is lost owing to a momentary channel dropout, the positive component p(k)=s1(I) and the negative component n(k)=s1(I+2)−s1(I) can nevertheless be reconstructed.

By means of the two channels, two symbols are always transmitted simultaneously, which improves the data throughput and the latency.

This once again corresponds to a "2-out-of-3 redundancy scheme" with regard to the transmissions; there is no redundancy with regard to the parallel channels.

Figure 17:
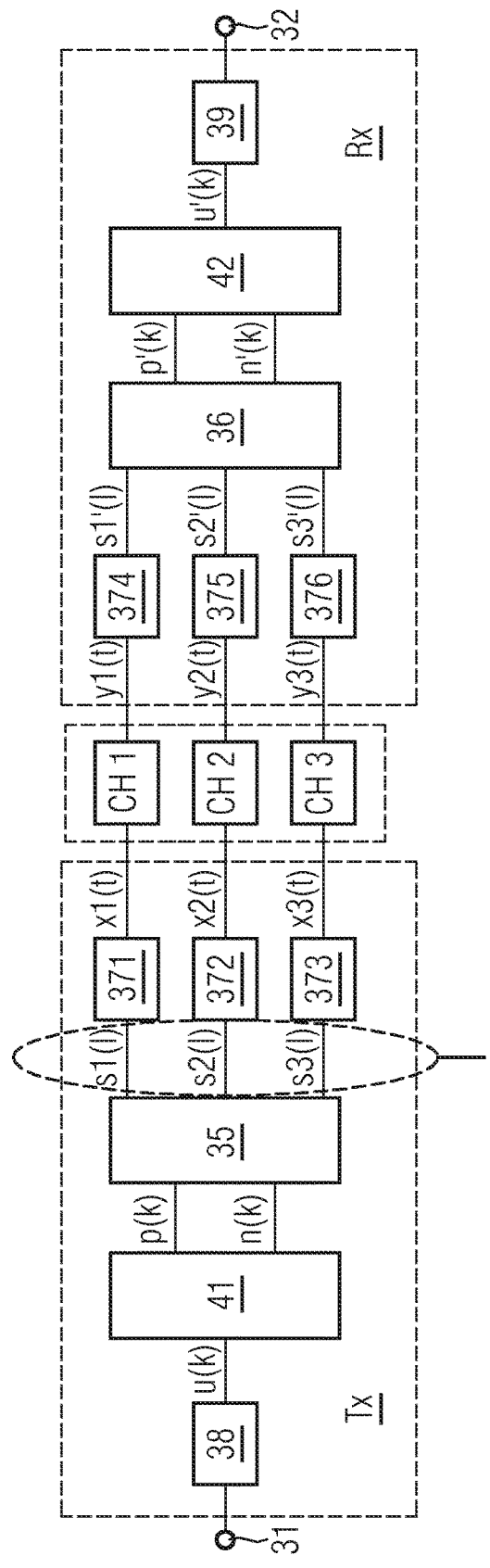
FIG. 17 shows a seventh embodiment, wherein here two symbols are transmitted in parallel via two channels in three transmissions with redundancy in the third transmission, wherein a third channel is additionally provided for the transmission of further redundant signal components.

FIG. 17 shows the first variant of a seventh embodiment, which is a mixture of the fifth and sixth embodiments. In this embodiment, two symbols, that is to say C=2 positive and C=2 negative components, are transmitted via N=3 channels in L=3 transmissions. The third transmission and the third channel add redundancy in order to increase the transmission reliability. In this embodiment, as in the sixth embodiment, two symbols are simultaneously transmitted sequentially via two channels. As can readily be seen in FIG. 17, the arrangement with the channels 1 and 2 corresponds exactly to the sixth embodiment. A third channel is new here, which, in a manner similar to that in the fifth embodiment, adds further redundancy, in this case the linear combination of the first and second symbols, wherein the positive components p(k=1) and p(k=2) are transmitted in a transmission having the index I=1 on the channel Ch 3. In the subsequent transmission having the index I=2, the negative components n(k=1) and n(k=2) are then transmitted on the channel Ch 3. The third transmission having the index I=3 is not required on the channel Ch 3; consequently, nothing is transmitted here. However, this transmission may be utilized for further redundancy or for other data for transmission.

Figure 18:
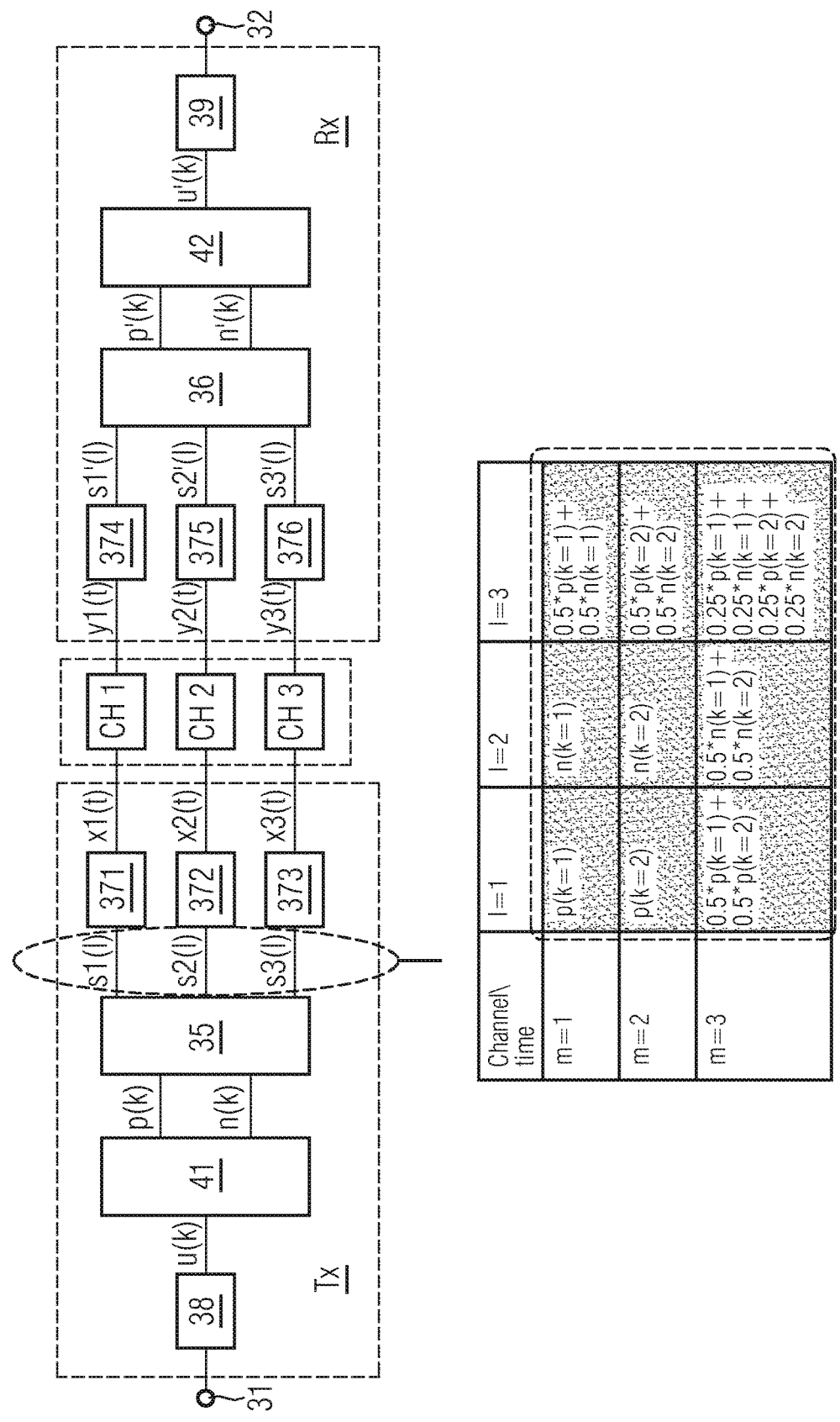
FIG. 18 shows an eighth embodiment, wherein here two symbols are transmitted in parallel via two channels in three transmissions with redundancy in the third transmission, wherein a third channel is additionally provided for the transmission of further redundant signal components in the third transmission as well.

This takes place in the second variant of the seventh embodiment, as shown in FIG. 18. The second variant of the seventh embodiment is very similar to the first variant of the seventh embodiment; therefore, only the differences with respect to the first variant of the seventh embodiment are described here.

In the second variant, the free transmission space on the third channel Ch 3 having the index I=3 is utilized for further redundancy.

On this transmission space, the positive and negative components of both symbols to be transmitted are transmitted in a linear combination:

$$0.25*p(k=1)+0.25*n(k=1)+0.25*p(k=2)+0.25*n(k=2)$$

Given entirely satisfactory reception, this information can be utilized in order to be able to reconstruct each of the signal components transmitted in these three indices, since here all the signal components are linearly linked with one another.

This once again corresponds to a "2-out-of-3 redundancy scheme" with regard to the parallel channels and the transmissions.

LIST OF REFERENCE SIGNS

ASK Amplitude Shift Keying
PAM Pulse Amplitude Modulation
QAM Quadrature Amplitude Modulation
OWC Optical Wireless Communication—Light-based communication
CME Conditional Mean Estimation—Condition expected value
MSE Mean Squared Error
SC Selection Combining—Selection of reception signals
MRC Maximum Ratio Combining—Weighted constructive combining according to the signal/noise ratio
EGC Equal Gain Combining—Additive constructive combining
AWGN Additive White Gaussian Noise—A channel model in which the influence of the channel on the payload signal is modeled by a noise signal having a constant spectral noise power density (white noise) and a signal amplitude having a Gaussian distribution, said noise signal being superposed on (added to) the payload signal
OFDM Orthogonal Frequency-Division Multiplexing
IM/DD Intensity Modulation/Direct Detection
FFT Fast Fourier Transformation
DCO-OFDM DC offset OFDM
ACO-OFDM Asymmetrically clipped OFDM signal
Flip-OFDM OFDM with inverted negative signal components
31 Input
32 Output
33 Demultiplexer
34 Multiplexer
35 Redundancy function module
36 Calculation module
38 Transmission converter
39 Reception converter
381 First transmission converter
382 Second transmission converter
391 First reception converter
392 Second reception converter
371, 372, 373 Transmission transducers
374, 375, 376 Reception transducers
41 Polarity separating module
42 Polarity combining module
x Transmitter-end data stream
x1, x2 Transmitter-end partial data streams
s1, s2, s3 Transmitter-end channel signals
Ch1, Ch2, Ch3 Channels
y1, y2, y3 Receiver-end channel signals
x1', x2' Receiver-end partial data streams
x' Receiver-end data stream

The invention claimed is:

1. A method for the redundant transmission of data by means of light-based communication, wherein the method comprises:
converting the data to a transmission data stream or stream of bipolar data symbols in a transmission converter;
dividing the transmission data stream into at least one transmission-end partial data stream using a demultiplexer;
converting the at least one transmission-end partial data stream into at least one signal having at least one component in a redundancy function module;
transmitting said at least one signal in one transmission per component using at least one transmission transducer via at least one light-based transmission channel;
receiving the at least one signal in at least one reception transducer;
converting the at least one received signal into at least one reception-end partial data stream in a calculation module;
multiplexing the reception-end partial data streams into a reception data stream using a multiplexer;
converting the reception data stream into the original data in a reception converter;
wherein for generating the redundancy either the number of light-based transmission channels is greater than the number of partial data streams n, or for generating the redundancy the number of transmissions per channel is greater than the number of partial data streams n, or for generating the redundancy the product of the light-based transmission channels and the transmissions per channel is greater than the number of partial data streams n; wherein the demultiplexer operates as a polarity separating module and the multiplexer operates as a polarity combining module, wherein the polarity separating module generates two unipolar-positive transmission-end partial data streams from the bipolar transmission data stream, and the polarity combining module generates a bipolar reception data stream from two unipolar-positive reception-end partial data streams.

2. The method as claimed in claim 1, further comprising forming redundancy linear combinations of the partial data streams, which are converted into redundant transmission signals in the redundancy function module, which redundant transmission signals are configured to be transmitted via an additional channel and/or in an additional transmission, wherein N>n holds true; in this case, the linear combinations can be written in the form $\tilde{A} \cdot \bar{x} = \bar{s}$, wherein $\tilde{A}$ is an N×n matrix.

3. The method as claimed in claim 2, wherein n arbitrarily selected rows in the matrix $\tilde{A}$ are linearly independent with respect to one another.

4. The method as claimed in claim 3, wherein n=2 and N=3.

5. The method as claimed in claim 3, wherein n=2 or n=3 and N=4.

6. The method as claimed in claim 2, wherein for each row in $\tilde{A}$ the sum of the coefficients is equal to 1.

7. The method as claimed in claim 1, wherein the transmission converter uses a bandpass modulation method as an output signal in the transmission converter and as an input signal in the reception converter.

8. The method as claimed in claim 1, wherein the transmission converter uses a modulation method with a real baseband signal as an output signal in the transmission converter and as an input signal in the reception converter.

9. The method as claimed in claim 1, wherein the transmission converter uses a modulation method with a unipolar signal as an output signal in the transmission converter and as an input signal in the reception converter.

10. The method as claimed in claim 1, wherein the transmission converter uses a modulation method with a bipolar signal as an output signal in the transmission converter and as an input signal in the reception converter, wherein said output signal is converted into two unipolar-positive signals in the polarity separating module, and wherein receptively in the polarity combining module the unipolar-positive signals are converted into the input signal.

11. The method as claimed in claim 1, wherein a conditional expected value is used for converting the at least one received signal into at least one reception-end partial data stream in a calculation module.

12. The method as claimed in claim 1, wherein a selection of reception signals is used for converting the at least one received signal into at least one reception-end partial data stream in a calculation module.

13. The method as claimed in claim 1, wherein weighted constructive combining according to the signal/noise ratio is used for converting the at least one received signal into at least one reception-end partial data stream in a calculation module.

14. The method as claimed in claim 1, wherein additive constructive combining is used for converting the at least one received signal into at least one reception-end partial data stream in a calculation module.

15. The method as claimed in claim 1, wherein for transmission via a light-based transmission channel, use is made of an intensity modulation with a direct detection during reception.

* * * * *